United States Patent
Lee et al.

(10) Patent No.: US 11,935,777 B2
(45) Date of Patent: Mar. 19, 2024

(54) SEMICONDUCTOR MANUFACTURING EQUIPMENT AND METHOD OF PROVIDING SUPPORT BASE WITH FILLING MATERIAL DISPOSED INTO OPENINGS IN SEMICONDUCTOR WAFER FOR SUPPORT

(71) Applicant: STATS ChipPAC Pte. Ltd., Singapore (SG)

(72) Inventors: HyeonChul Lee, Incheon (KR); HunTeak Lee, Gyeongi-do (KR); HyunSu Tak, Incheon (KR); Wanil Lee, Incheon (KR); InHo Seo, Seoul (KR)

(73) Assignee: STATS ChipPAC Pte Ltd., Singapore (SG)

( * ) Notice: Subject to any disclaimer, the term of this patent is extended or adjusted under 35 U.S.C. 154(b) by 120 days.

(21) Appl. No.: 17/457,155

(22) Filed: Dec. 1, 2021

(65) Prior Publication Data
US 2023/0170242 A1    Jun. 1, 2023

(51) Int. Cl.
*H01L 21/683* (2006.01)
*H01L 21/56* (2006.01)
*H01L 21/77* (2017.01)

(52) U.S. Cl.
CPC ........ *H01L 21/6835* (2013.01); *H01L 21/561* (2013.01); *H01L 21/77* (2013.01)

(58) Field of Classification Search
CPC ........... H01L 21/76251; H01L 21/6835; H01L 2221/6839; H01L 21/02021; H01L 27/1203; H01L 29/66772; H01L 21/2007; H01L 21/76256

USPC ......................................................... 257/506
See application file for complete search history.

(56) References Cited

U.S. PATENT DOCUMENTS

| | | | |
|---|---|---|---|
| 5,762,259 A * | 6/1998 | Hubacher | H05K 3/3485 228/248.1 |
| 6,217,655 B1 | 4/2001 | Kumar et al. | |
| 6,450,850 B1 * | 9/2002 | Nunomura | H01J 9/242 445/24 |
| 6,755,221 B2 * | 6/2004 | Jeong | H01L 21/67259 206/711 |
| 7,126,216 B2 * | 10/2006 | Silverbrook | H01L 21/50 438/106 |

(Continued)

*Primary Examiner* — Vu A Vu
(74) *Attorney, Agent, or Firm* — Robert D. Atkins; PATENT LAW GROUP: Atkins and Associates, P.C.

(57) ABSTRACT

A semiconductor device is manufactured using a support base and a filling material formed on the support base. The filling material can be a plurality of protrusions or penetrable film. The protrusions are attached to the support base with an adhesive. The protrusions have a variety of shapes such as square frustum, conical frustum, three-sided pyramid with a flat top, four-sided rectangular body, and elongated square frustum. A semiconductor wafer is disposed over the support base with the filling material extending into openings in the semiconductor wafer. The openings in the semiconductor wafer can have slanted sidewalls, or a more complex shape such as ledges and vertical projections. The filling material may substantially fill the openings in the semiconductor wafer. The protrusions may partially fill the openings in the semiconductor wafer. The protrusions occupy at least a center of the openings in the semiconductor wafer.

25 Claims, 20 Drawing Sheets

(56) References Cited

U.S. PATENT DOCUMENTS

| | | | | |
|---|---|---|---|---|
| 7,666,709 B1* | 2/2010 | Lin | ................... | H01L 21/6835 |
| | | | | 438/109 |
| 7,733,408 B2* | 6/2010 | Tsukamoto | ....... | H01L 27/14618 |
| | | | | 348/340 |
| 9,025,917 B2* | 5/2015 | Aoki | ...................... | G02B 6/327 |
| | | | | 385/74 |
| 9,679,930 B2* | 6/2017 | Hori | ................. | H01L 27/14618 |
| 2006/0046433 A1* | 3/2006 | Sterrett | ............... | H01L 21/6836 |
| | | | | 438/459 |
| 2006/0255412 A1* | 11/2006 | Ramaswamy | .. | H01L 21/823437 |
| | | | | 257/E21.429 |
| 2007/0153453 A1 | 7/2007 | Wang et al. | | |
| 2009/0325471 A1* | 12/2009 | Chou | ................. | B24D 18/0009 |
| | | | | 51/298 |
| 2011/0049704 A1* | 3/2011 | Sun | ........................ | H01L 21/50 |
| | | | | 257/E23.116 |
| 2016/0136787 A1 | 5/2016 | Bajaj et al. | | |

* cited by examiner

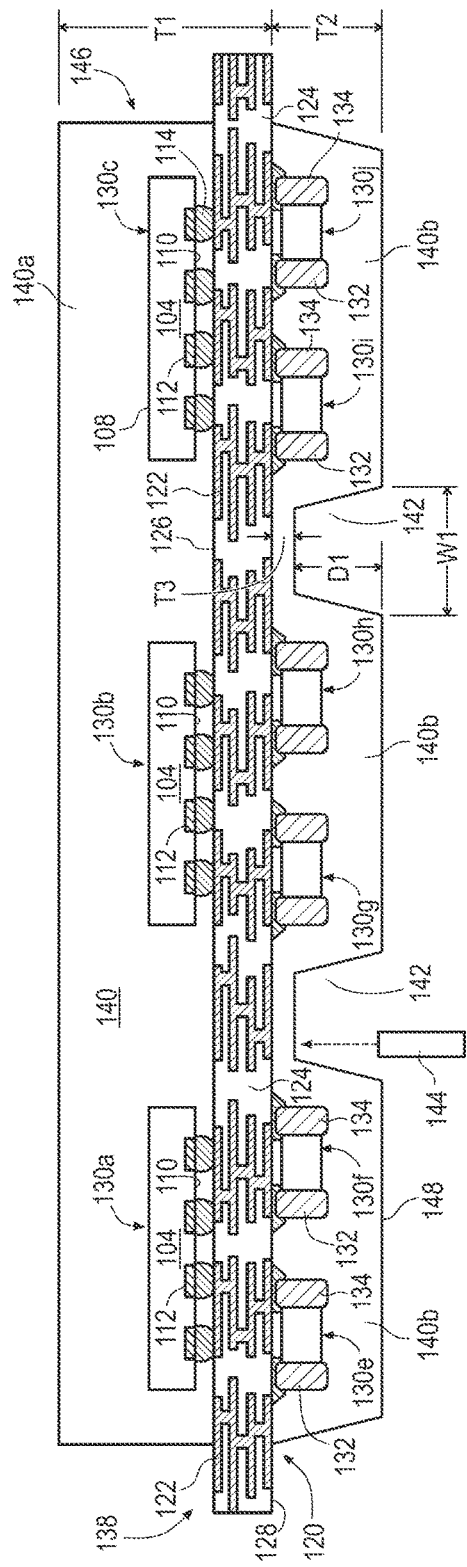
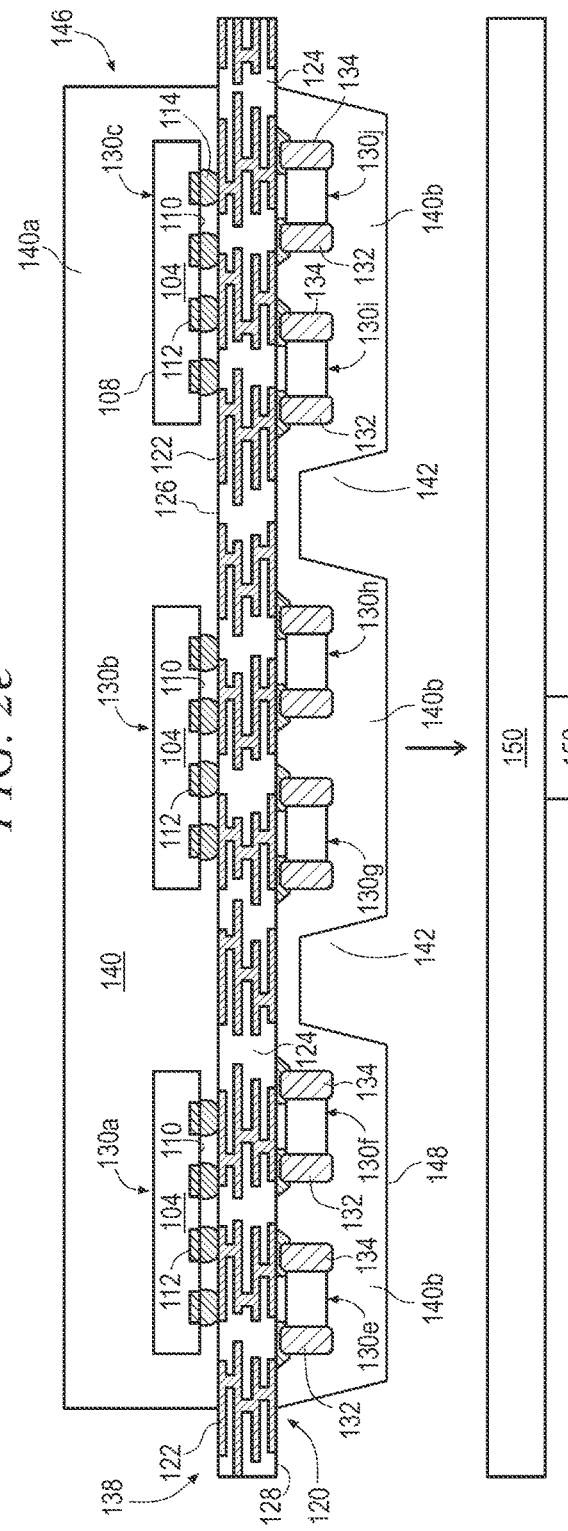
FIG. 2e
FIG. 2f

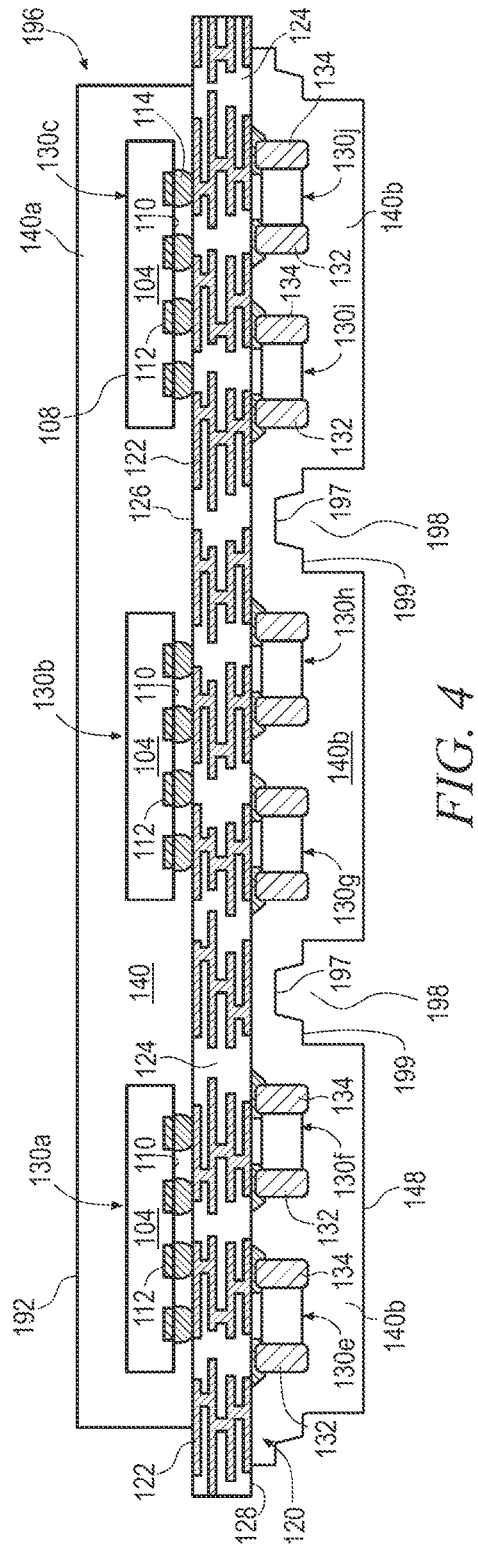
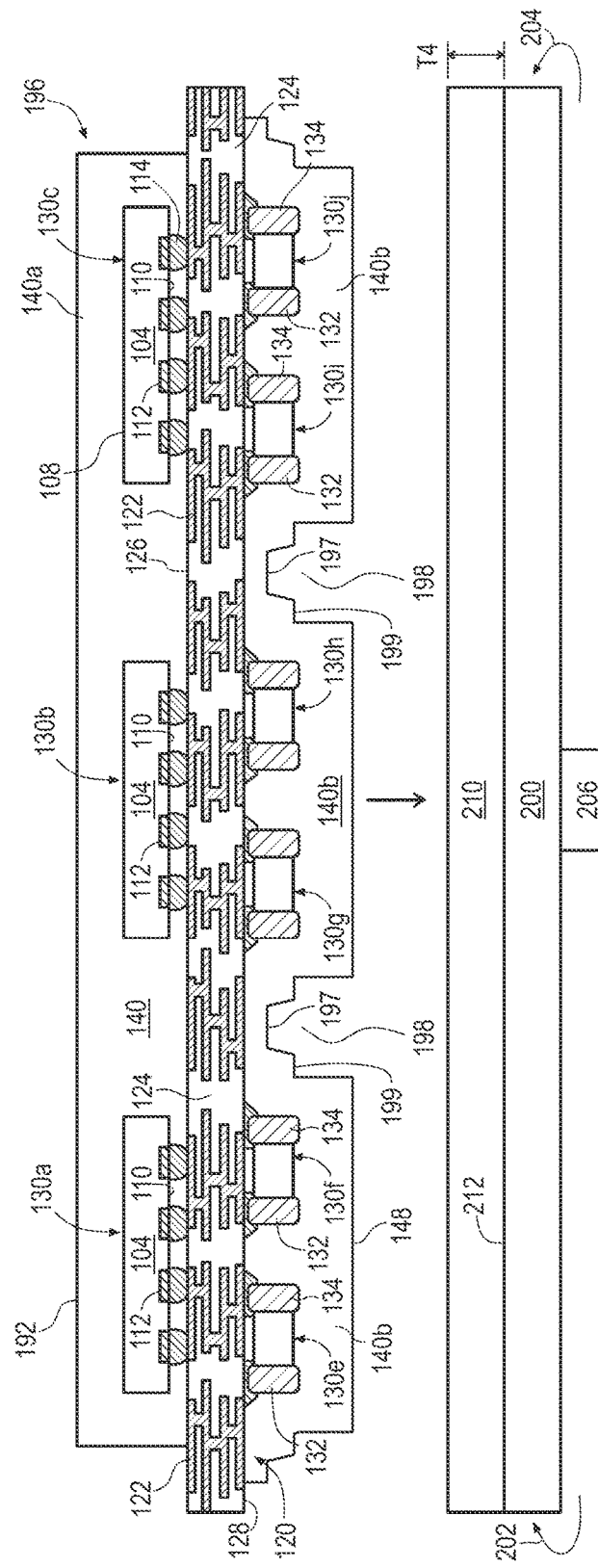

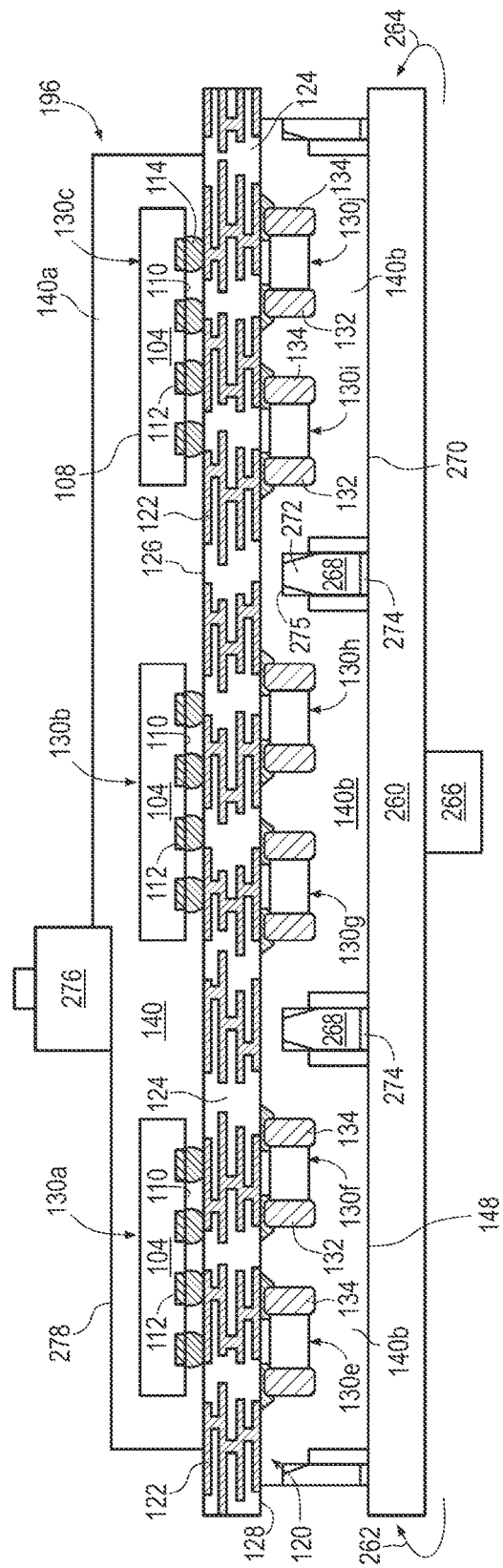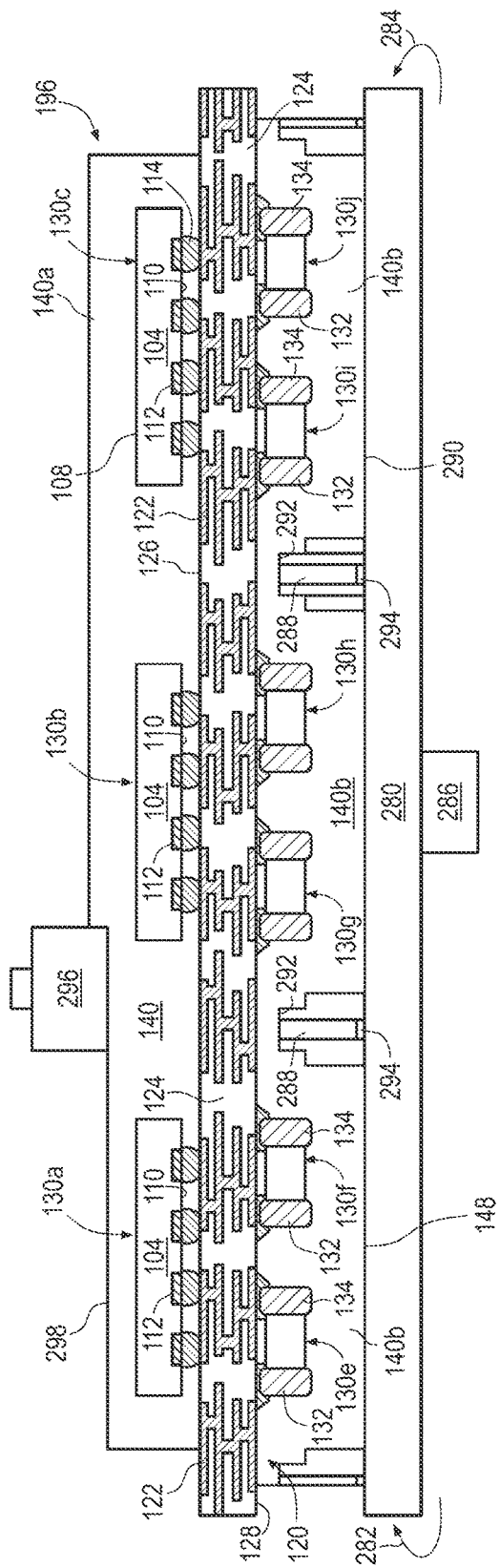

US 11,935,777 B2

1

SEMICONDUCTOR MANUFACTURING EQUIPMENT AND METHOD OF PROVIDING SUPPORT BASE WITH FILLING MATERIAL DISPOSED INTO OPENINGS IN SEMICONDUCTOR WAFER FOR SUPPORT

FIELD OF THE INVENTION

The present invention relates in general to semiconductor devices and, more particularly, to a semiconductor manufacturing equipment and method of disposing a semiconductor wafer over a support base with filling material extending into openings in an encapsulant of the semiconductor wafer for structural support in a grinding operation.

BACKGROUND OF THE INVENTION

Semiconductor devices are commonly found in modern electronic products. Semiconductor devices perform a wide range of functions, such as signal processing, high-speed calculations, transmitting and receiving electromagnetic signals, controlling electronic devices, photo-electric, and creating visual images for television displays. Semiconductor devices are found in the fields of communications, power conversion, networks, computers, entertainment, and consumer products. Semiconductor devices are also found in military applications, aviation, automotive, industrial controllers, and office equipment.

A semiconductor wafer can contain electrical components mounted to an interconnect substrate and covered by an encapsulant. The encapsulant can contain a plurality of openings for package design purposes. A surface of the encapsulant may require planarization with a grinder. The semiconductor wafer is placed on a grinding chuck or other support base for a grinding operation. A portion of the encapsulant is removed by the grinder to planarize the surface of the encapsulant. However, the interconnect substrate has reduced support in areas proximate to the openings in the encapsulant. As the grinder applies pressure to the surface of the encapsulant being planarized, there is less supporting encapsulant material proximate to the openings under the interconnect substrate. Accordingly, the interconnect substrate is subject to bending, sinking, cracking, chipping, and other damages, particularly as the pressure and force of the grinder passes over the weak point in the encapsulant proximate to the openings.

BRIEF DESCRIPTION OF THE DRAWINGS

FIG. 4 illustrates another embodiment of more complex openings in the encapsulant of the semiconductor wafer;

FIGS. 5a-5c illustrate providing a support base with penetrable film disposed into openings in an encapsulant;

FIG. 8 illustrates another embodiment of the protrusions disposed into openings in the encapsulant;

2

Figure 10:
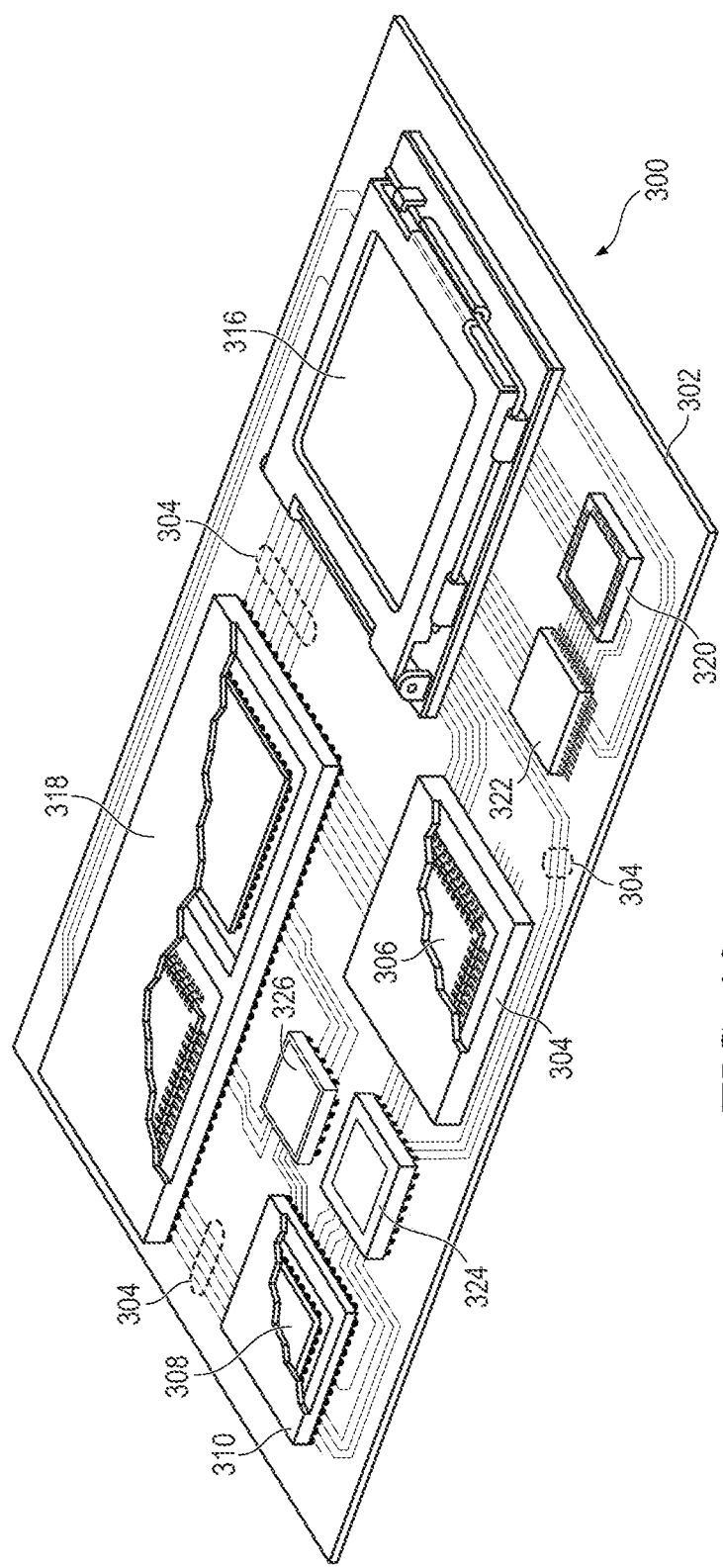

FIG. 9 illustrates another embodiment of the protrusions disposed into openings in the encapsulant; and FIG. 10 illustrates a printed circuit board (PCB) with different types of packages mounted to a surface of the PCB.

DETAILED DESCRIPTION OF THE DRAWINGS

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings. The term "semiconductor die" as used herein refers to both the singular and plural form of the words, and accordingly, can refer to both a single semiconductor device and multiple semiconductor devices.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions.

Back-end manufacturing refers to cutting or singulating the finished wafer into the individual semiconductor die and packaging the semiconductor die for structural support, electrical interconnect, and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with conductive layers, bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

Figure 1A:
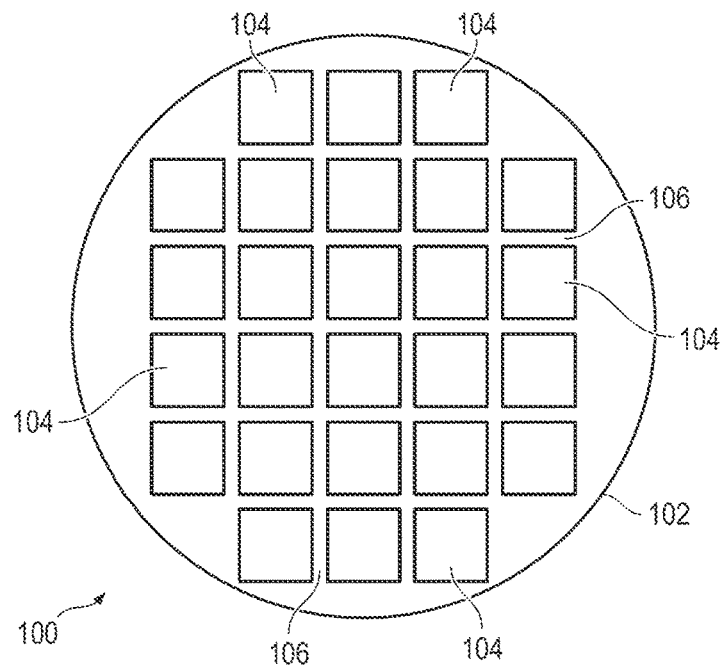
FIGS. 1a-1c illustrate a semiconductor wafer with a plurality of semiconductor die separated by a saw street.

FIG. 1a shows a semiconductor wafer 100 with a base substrate material 102, such as silicon, germanium, aluminum phosphide, aluminum arsenide, gallium arsenide, gallium nitride, indium phosphide, silicon carbide, or other bulk material for structural support. A plurality of semiconductor die or components 104 is formed on wafer 100 separated by a non-active, inter-die wafer area or saw street 106. Saw street 106 provides cutting areas to singulate semiconductor wafer 100 into individual semiconductor die 104. In one embodiment, semiconductor wafer 100 has a width or diameter of 100-450 millimeters (mm).

Figure 1B:
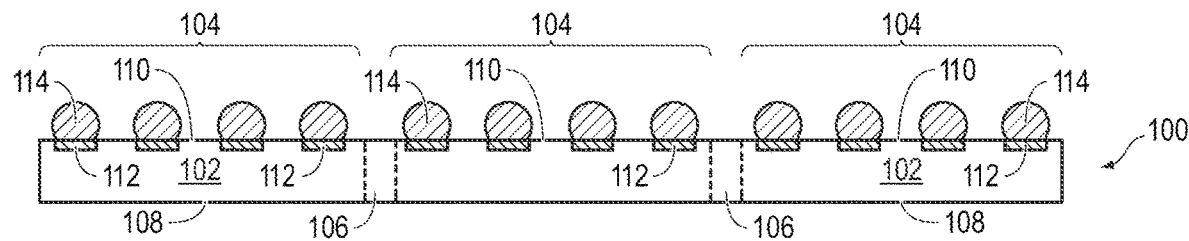

FIG. 1B shows a cross-sectional view of a portion of semiconductor wafer 100. Each semiconductor die 104 has a back or non-active surface 108 and an active surface 110 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 110 to implement analog circuits or digital circuits, such as digital signal processor (DSP), application specific integrated circuits (ASIC), memory, or other signal processing circuit. Semiconductor die 104 may also contain IPDs, such as inductors, capacitors, and resistors, for RF signal processing.

An electrically conductive layer 112 is formed over active surface 110 using PVD, CVD, electrolytic plating, electroless plating process, or other suitable metal deposition process. Conductive layer 112 can be one or more layers of aluminum (Al), copper (Cu), tin (Sn), nickel (Ni), gold (Au), silver (Ag), or other suitable electrically conductive material. Conductive layer 112 operates as contact pads electrically connected to the circuits on active surface 110.

An electrically conductive bump material is deposited over conductive layer 112 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 112 using a suitable attachment or bonding process. In one embodiment, the bump material is reflowed by heating the material above its melting point to form balls or bumps 114. In one embodiment, bump 114 is formed over an under bump metallization (UBM) having a wetting layer, barrier layer, and adhesive layer. Bump 114 can also be compression bonded or thermocompression bonded to conductive layer 112. Bump 114 represents one type of interconnect structure that can be formed over conductive layer 112. The interconnect structure can also use bond wires, conductive paste, stud bump, micro bump, or other electrical interconnect.

Figure 1C:
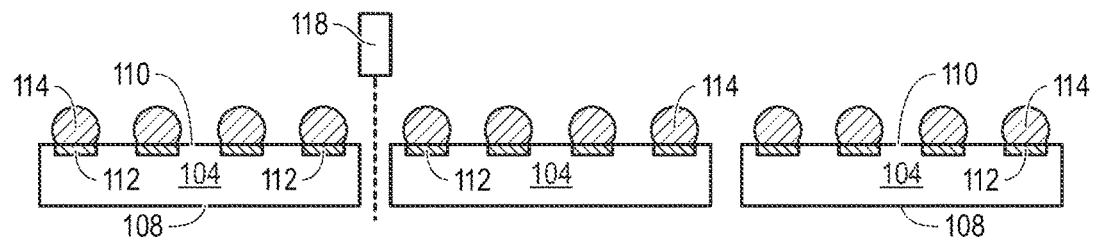

In FIG. 1c, semiconductor wafer 100 is singulated through saw street 106 using a saw blade or laser cutting tool 118 into individual semiconductor die 104. The individual semiconductor die 104 can be inspected and electrically tested for identification of known good die or unit (KGD/KGU) post singulation.

Figure 2A:
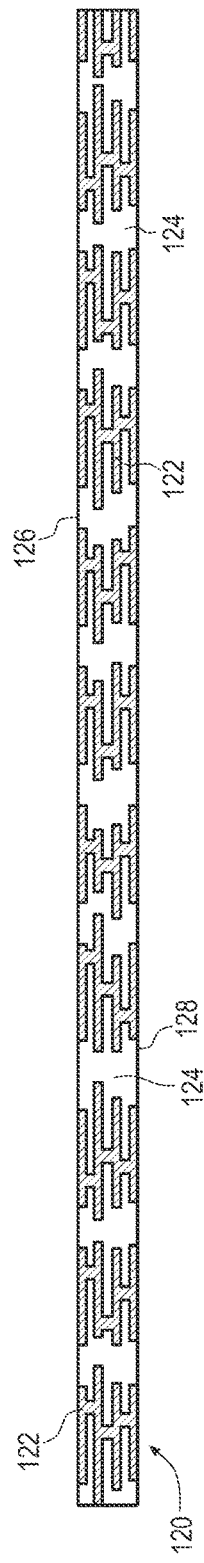
FIGS. 2a-2p illustrate a process of providing a support base with protrusions disposed into openings in an encapsulant of a semiconductor wafer for support.
Figure 2B:
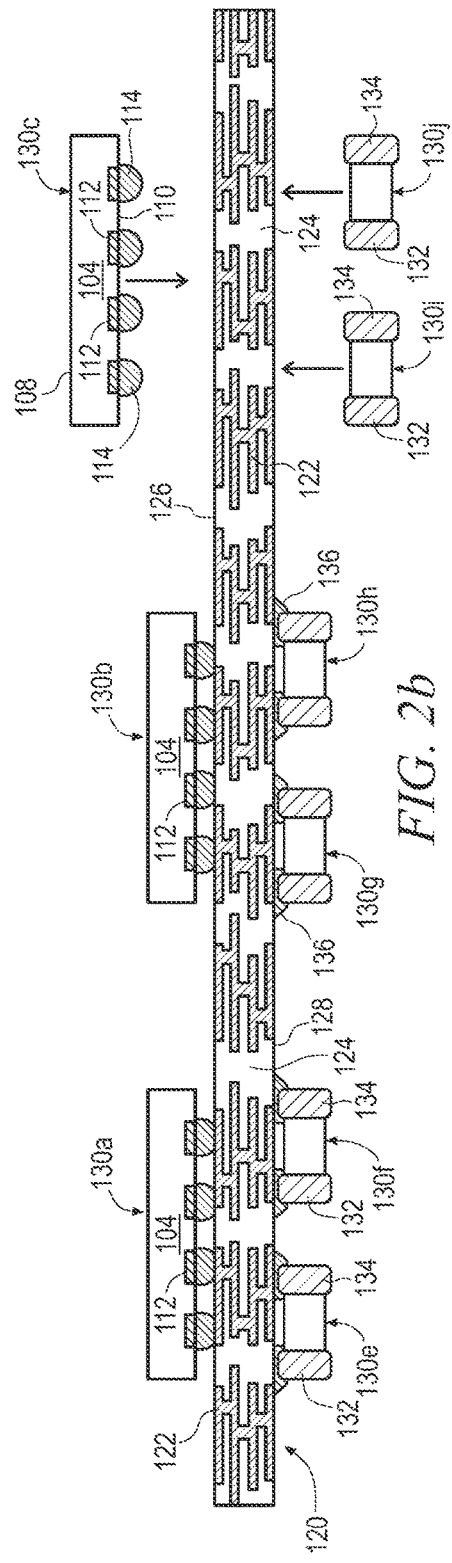
Figure 2C:
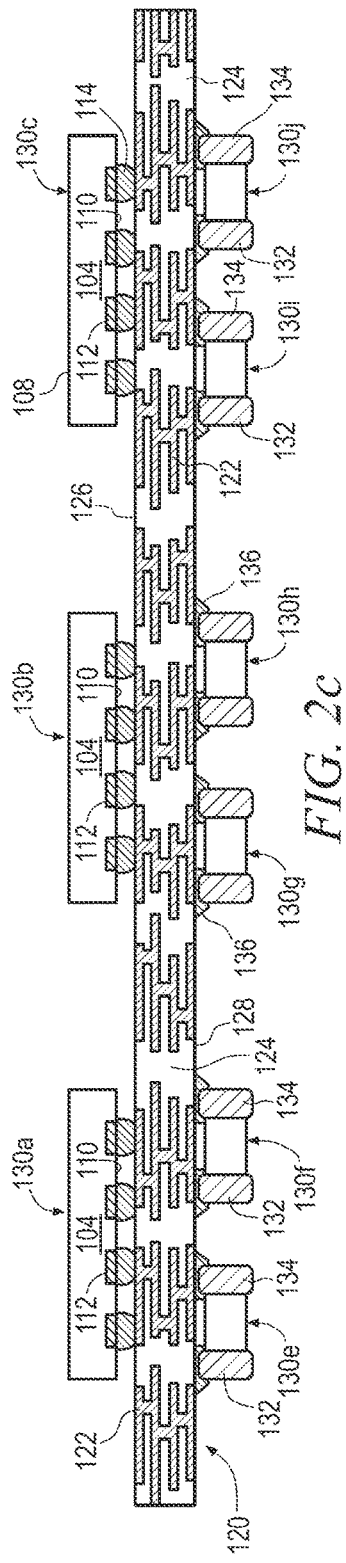
Figure 2D:
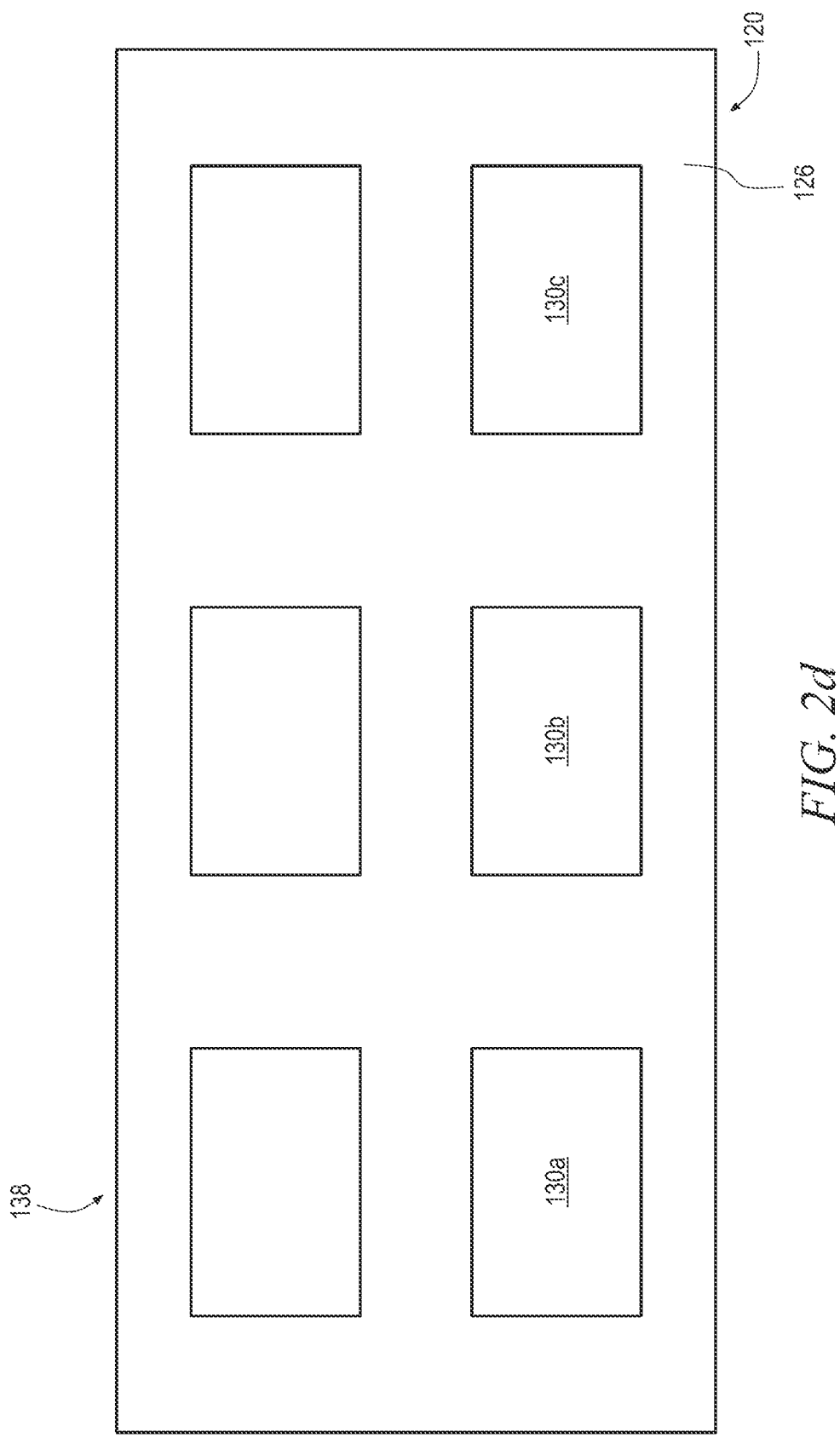
Figure 2G:
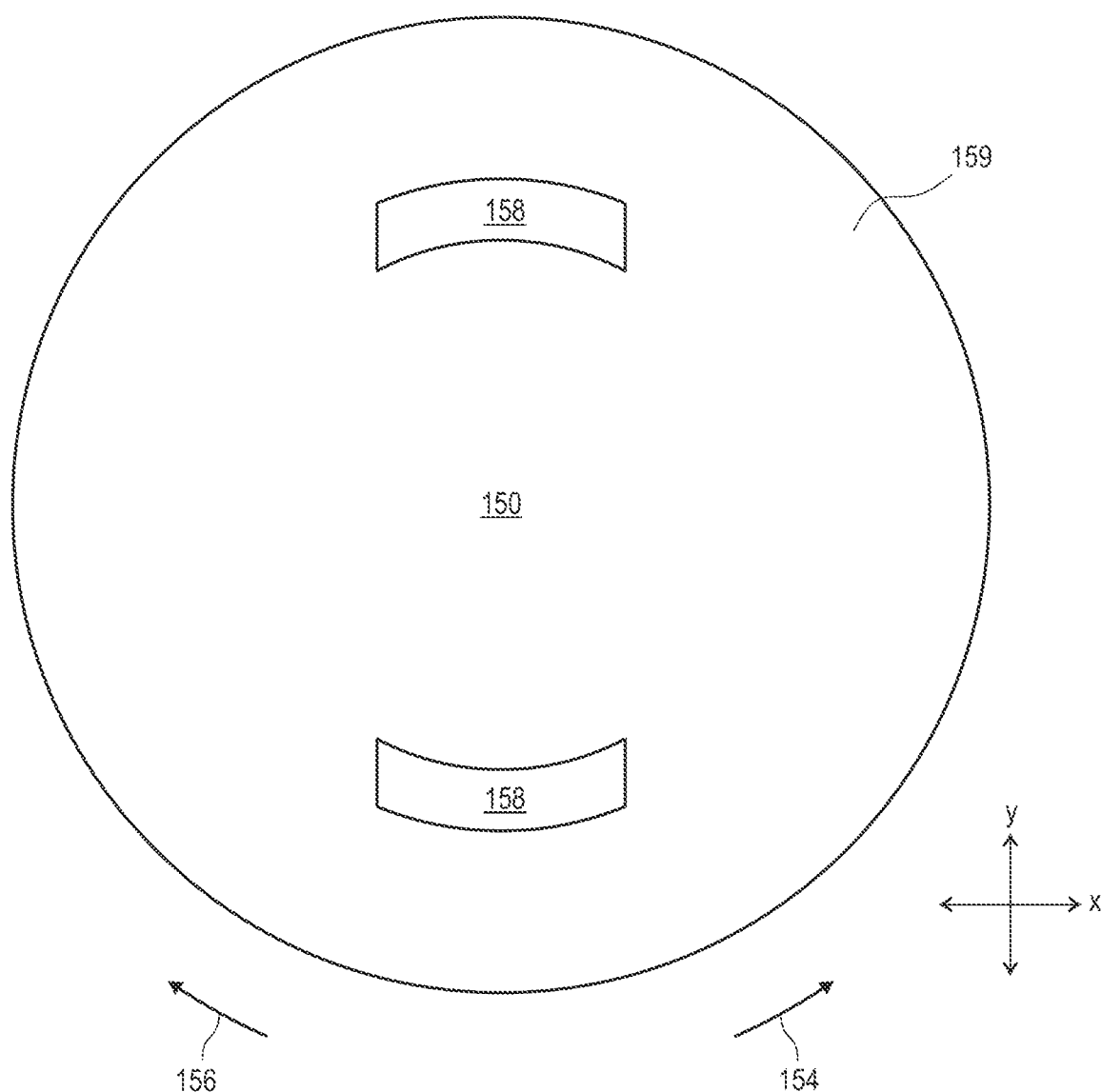
Figure 2H:
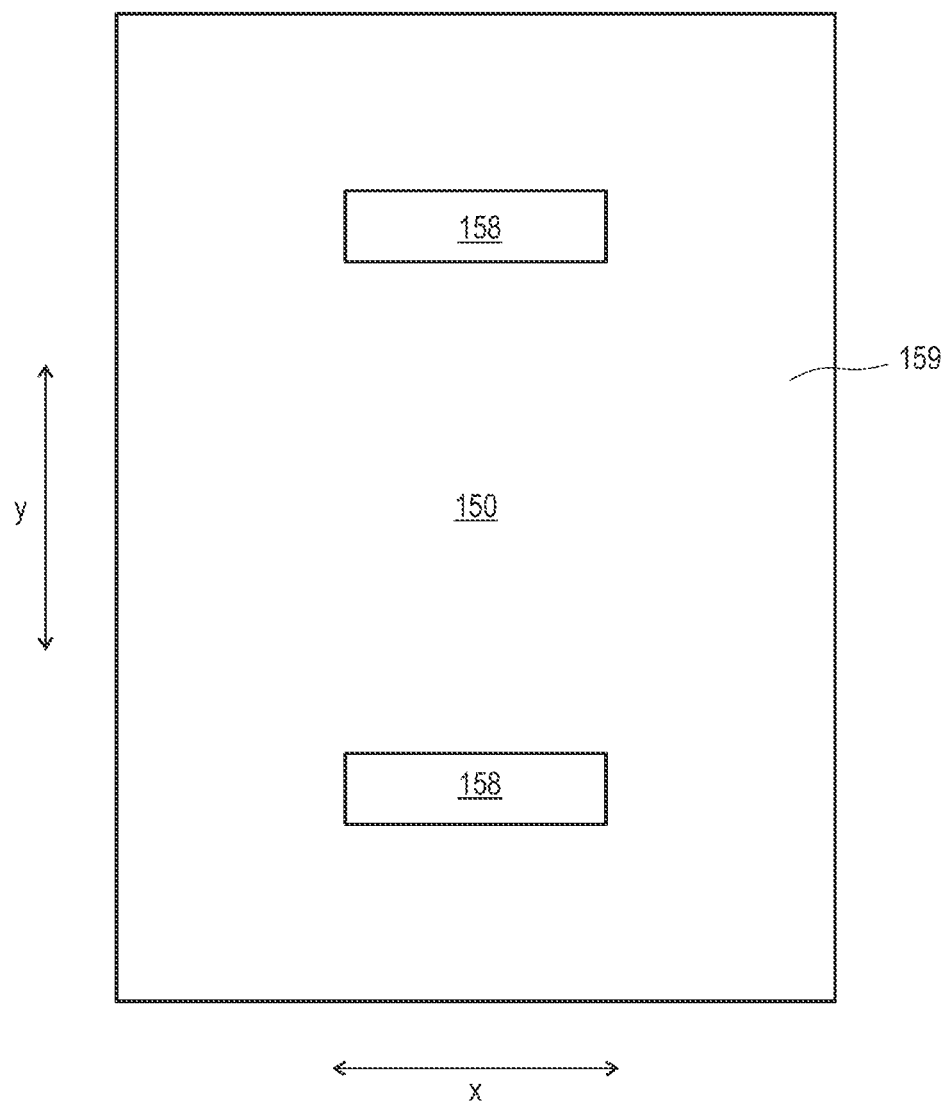
Figure 2I:
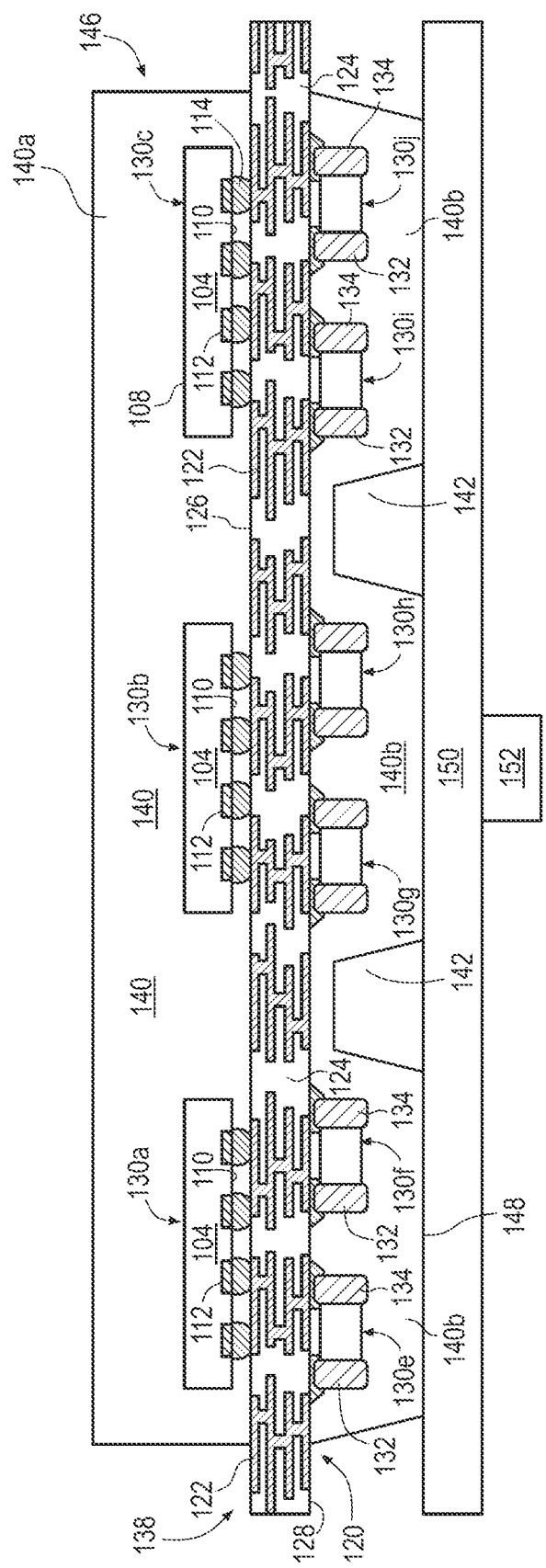
Figure 2J:
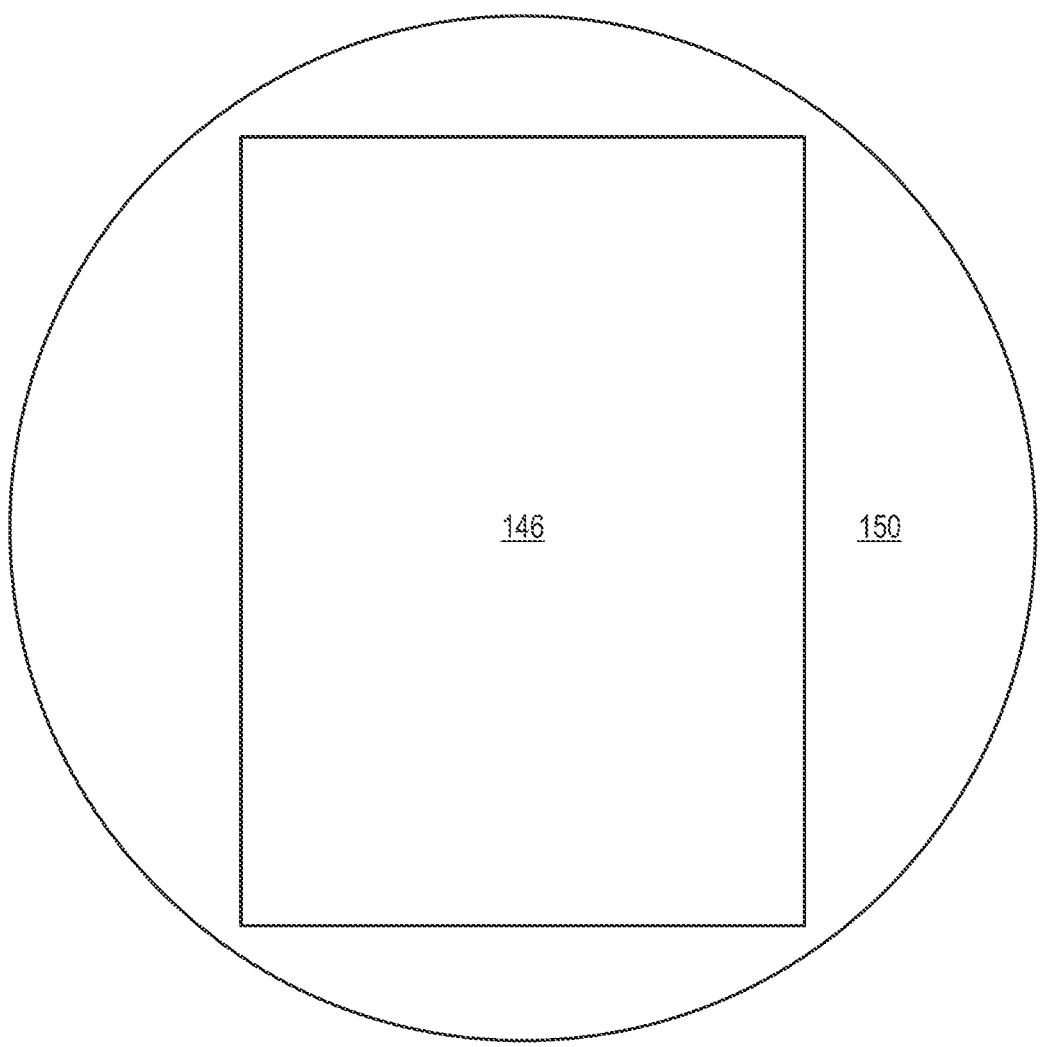
Figure 2K:
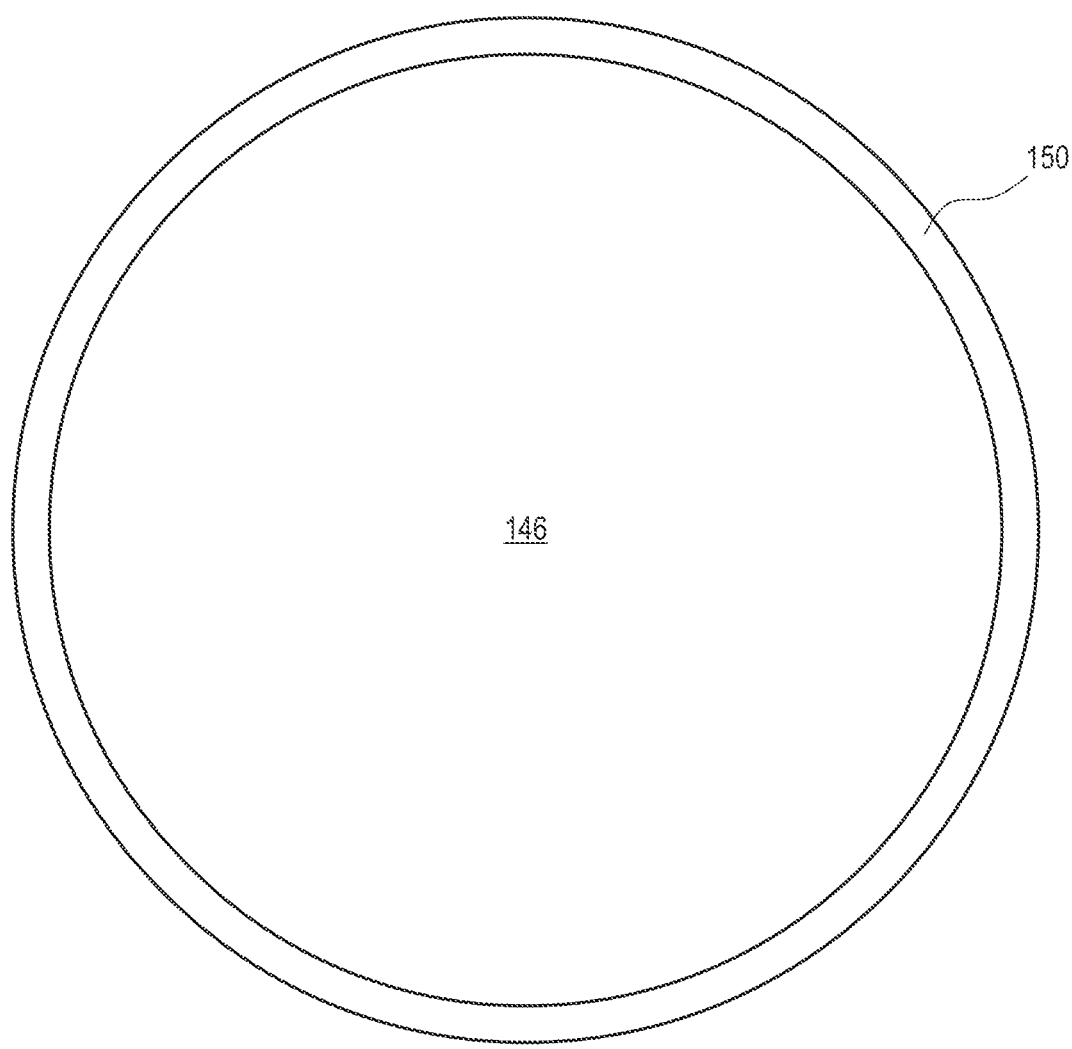
Figure 2L:
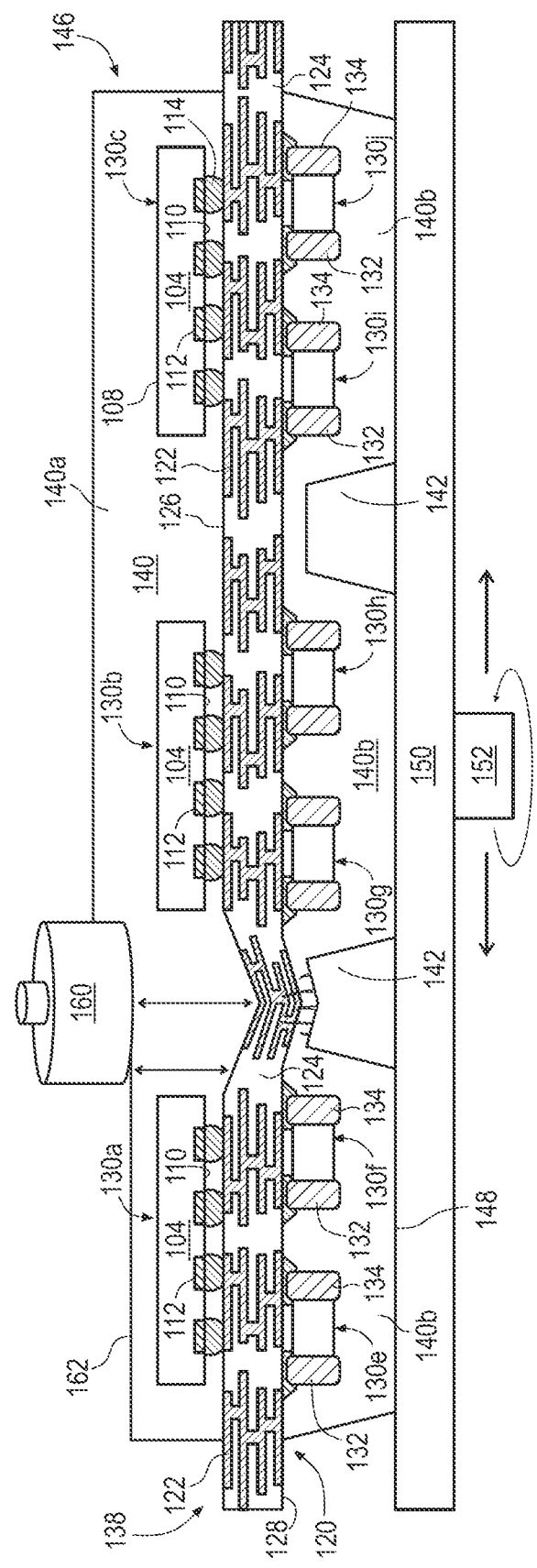
Figure 2M:
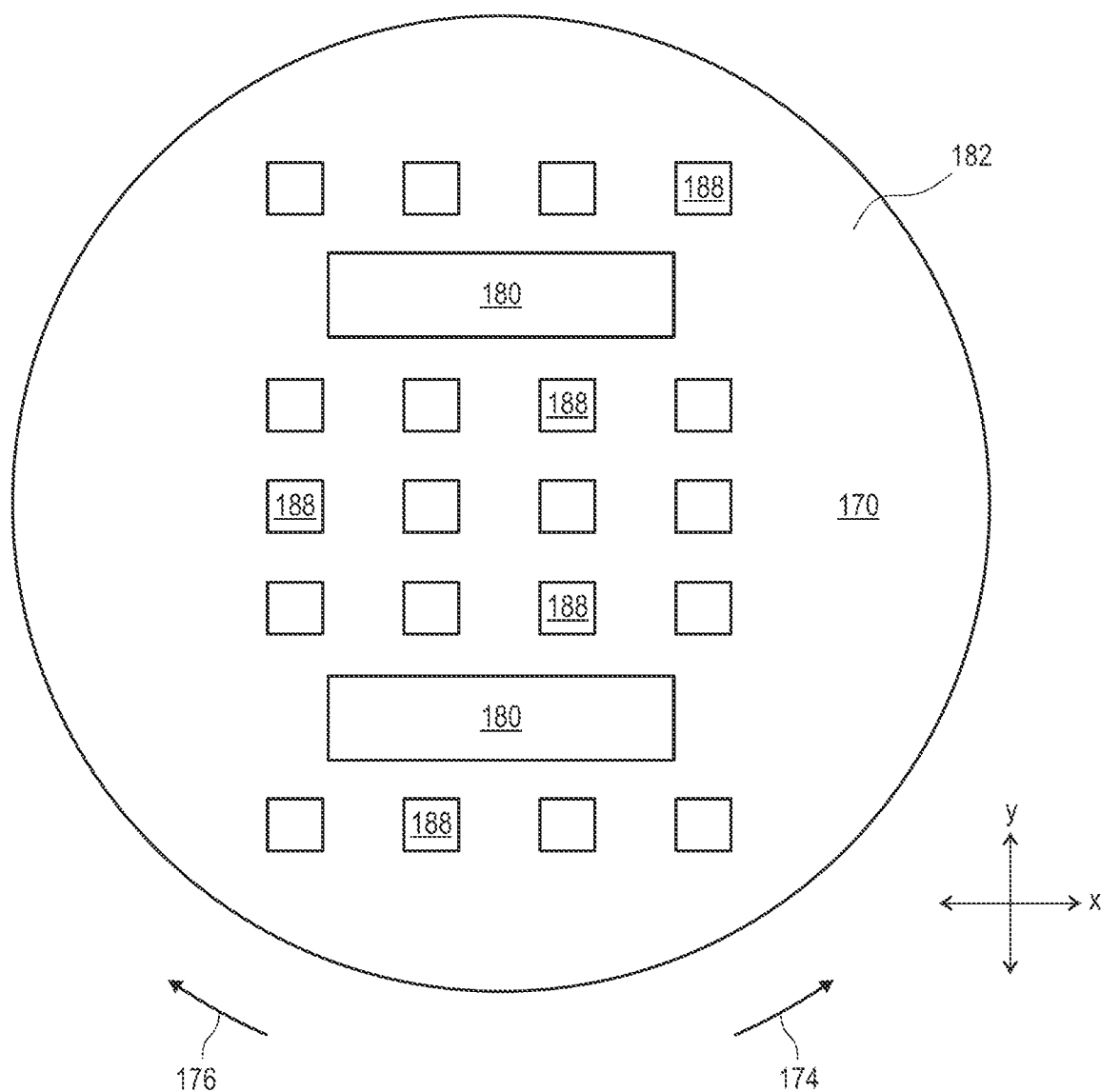
Figure 2N:
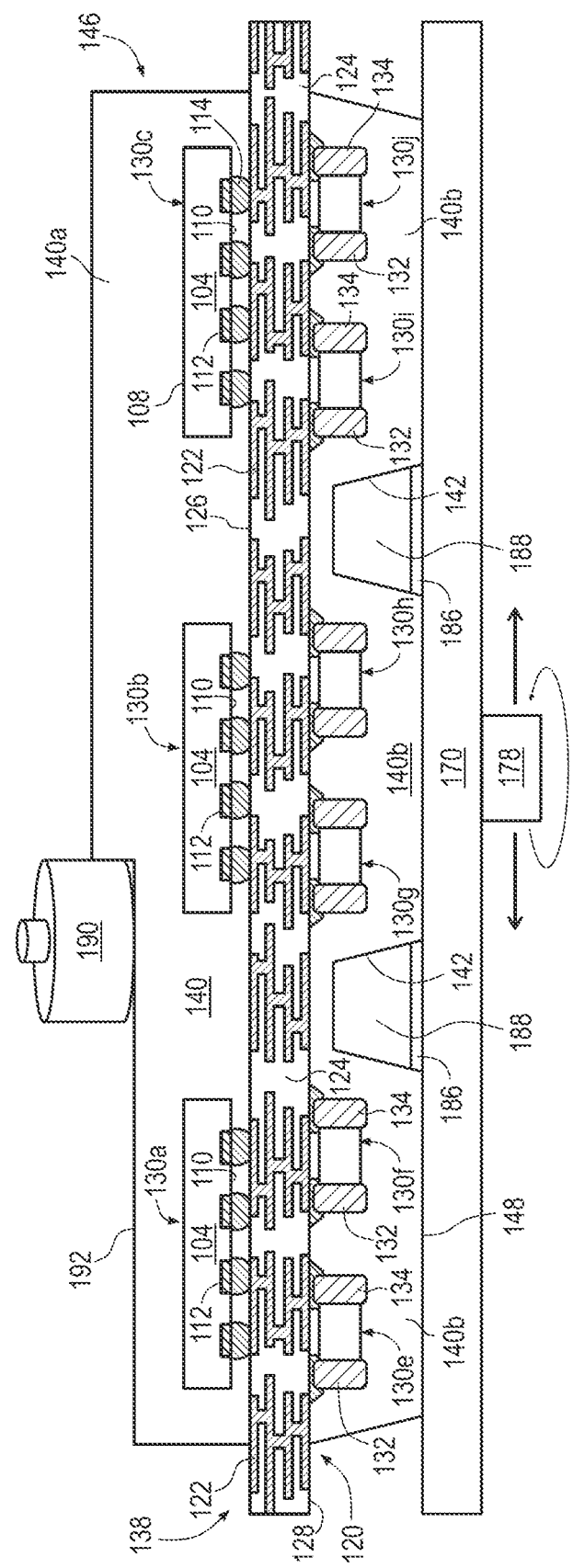
Figure 2O:
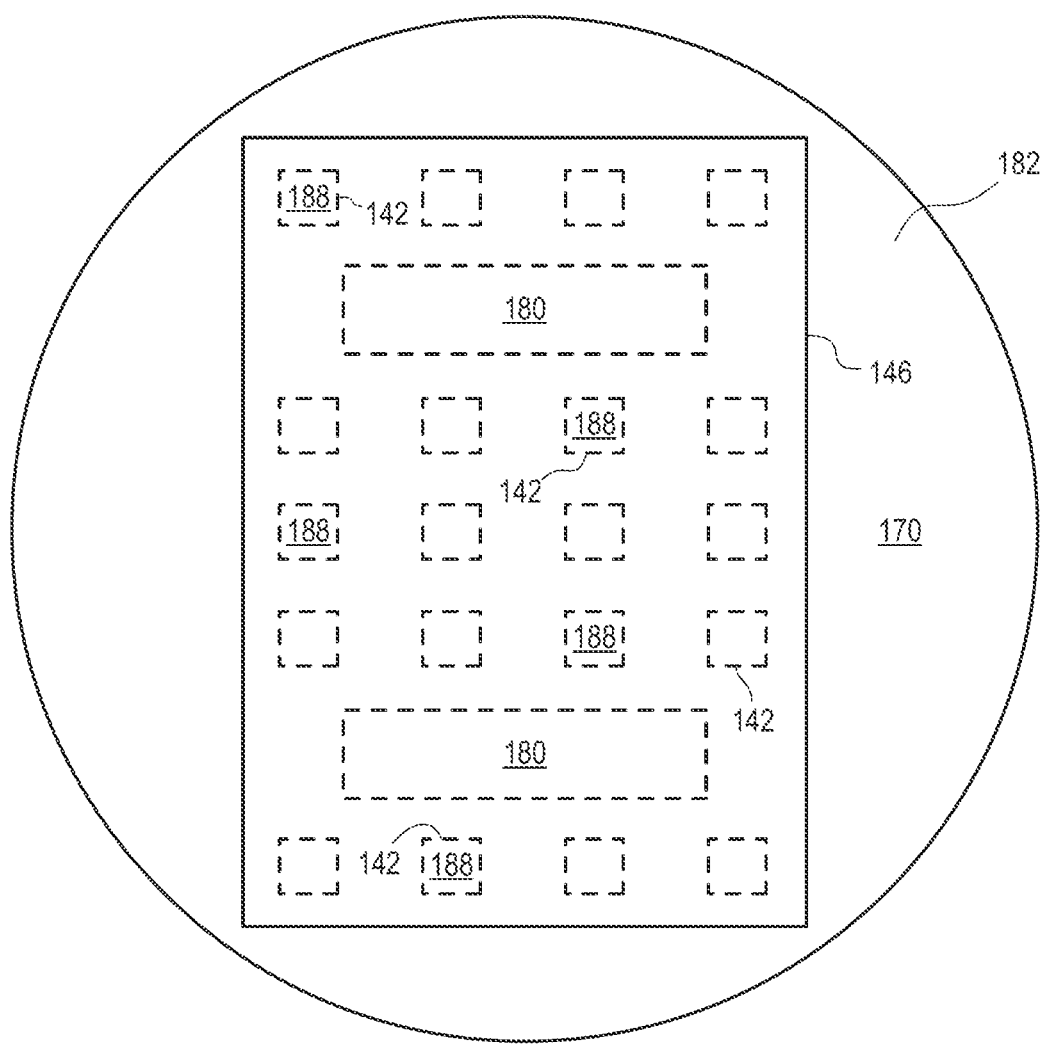
Figure 2P:
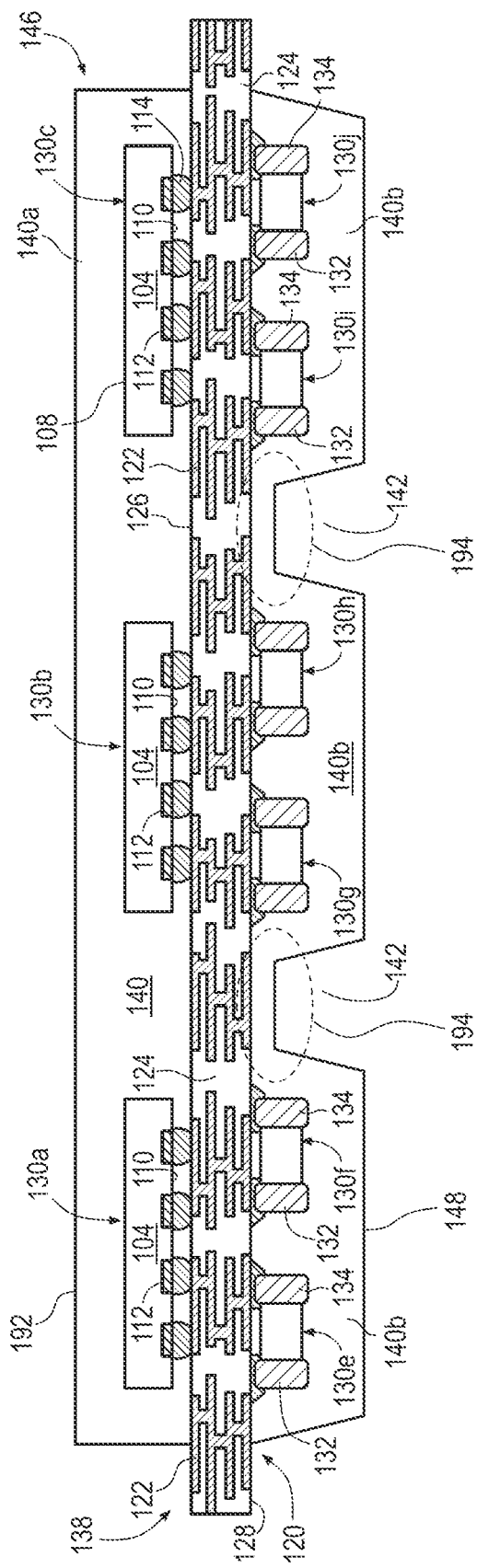

FIGS. 2a-2p illustrate a process of disposing a semiconductor wafer over a support base with protrusions extending into openings in an encapsulant of the semiconductor wafer for support in a grinding operation. FIG. 2a shows a cross-sectional view of interconnect substrate 120 including conductive layers 122 and insulating layer 124. Interconnect substrate 120 can be rectangular or circular in shape. Conductive layer 122 can be one or more layers of Al, Cu, Sn, Ni, Au, Ag, or other suitable electrically conductive material. Conductive layer 122 provides horizontal electrical interconnect across substrate 120 and vertical electrical interconnect between top surface 126 and bottom surface 128 of substrate 120. Portions of conductive layer 122 can be electrically common or electrically isolated depending on the design and function of semiconductor die 104 and other electrical components. Insulating layer 124 contains one or more layers of silicon dioxide ($SiO_2$), silicon nitride ($Si_3N_4$), silicon oxynitride (SiON), tantalum pentoxide ($Ta_2O_5$), aluminum oxide ($Al_2O_3$), solder resist, polyimide, benzocyclobutene (BCB), polybenzoxazoles (PBO), and other material having similar insulating and structural properties. Insulating layer 124 provides isolation between conductive layers 122.

In FIGS. 2b-2c, electrical components 130a-130j are mounted to surface 126 and surface 128 of interconnect substrate 120 and electrically and mechanically connected to conductive layers 122. Electrical components 130a-130j are positioned over substrate 120 using a pick and place operation. For example, electrical components 130a-130c can be semiconductor die 104 from FIG. 1c with active surface 110 and bumps 114 oriented toward surface 126 of substrate 120. Electrical components 130d-130j can be discrete semiconductor devices, such as resistors, capacitors, inductors, diodes, transistors, and the like. Terminals 132 and 134 of each electrical component 130d-130j are mounted to surface 128 of interconnect substrate 120 with conductive paste 136. Alternatively, electrical components 130a-130j can include other semiconductor die, semiconductor package, surface mount device, discrete electrical device, discrete transistor, diode, or IPD. Electrical components 130a-130j are mounted to surface 126 and surface 128 of interconnect substrate 120, as shown in FIG. 2c, with bumps 114 and terminals 132-134 making mechanical and electrical connection to conductive layer 122. FIG. 2d is a top view of interconnect substrate 120 with electrical components 130a-130c, also referred to as strip 138. In another embodiment, interconnect substrate 120 with electrical components 130a-130c can also have a round shape as in a circular reconstituted wafer.

In FIG. 2e, encapsulant or molding compound 140 is deposited over and around electrical components 130a-130j and surface 126 and surface 128 of interconnect substrate 120 as a double-sided mold using a paste printing, compressive molding, transfer molding, liquid encapsulant molding, vacuum lamination, spin coating, or other suitable applicator. In particular, encapsulant 140a is deposited over and around electrical components 130a-130c and surface 126 of interconnect substrate 120, and encapsulant 140b is deposited over and around electrical components 130d-130j and surface 128 of interconnect substrate 120. Encapsulant 140 can be polymer composite material, such as epoxy resin with filler, epoxy acrylate with filler, or polymer with proper filler. Encapsulant 140 is non-conductive, provides structural support, and environmentally protects the semiconductor device from external elements and contaminants.

Encapsulant 140b can be selectively deposited over and around electrical components 130d-130j and surface 128 of interconnect substrate 120 using a mold chase and leaving openings or recesses 142 extending through encapsulant 140b between electrical components 130d-130j for package design purposes. In practice, openings 142 are made by a mold chase shape during encapsulation. The mold chase shape corresponds to the opening shape. In one embodiment, the thickness T1 of encapsulant 140a is 0.28 mm. The thickness T2 of encapsulant 140b is 720 μm. Openings 142 have a width W1 of 1.0-2.0 mm, and a depth D1 of 500-700 micrometers (μm), leaving a thickness T3 of 0.10-0.123 μm. Thickness T2 is greater than thickness T3. Alternatively, encapsulant 140b is deposited completely over and around electrical components 130d-130j and surface 128 of interconnect substrate 120 with thickness T2. A portion of encapsulant 140b is then removed by etching or laser direction ablation (LDA) using laser 144, leaving similar openings or recesses 142. Openings 142 may leave some portion of encapsulant 140b over surface 128, as shown in FIG. 2e, or openings 142 may extend to surface 128 of interconnect substrate 120. In any case, double-sided molding leaves different molding shapes on the top side and bottom side.

In FIG. 2f, semiconductor wafer or substrate 146 with electrical components 130a-103j mounted to interconnect substrate 120 and covered by encapsulant 140 is positioned over grinding chuck or support base 150. Semiconductor wafer 146 may contain many more electrical components. Electrical components 130a-130j are shown for illustration purposes and not drawn to scale. Grinding chuck 150 is a circular or rectangular platform and support base for semiconductor wafer 146. FIG. 2g is a top view of a circular grinding chuck 150 with a plurality of ports 158 formed in surface 159 to draw a vacuum on semiconductor wafer 146 to hold the wafer in place during rotation and grinding. Grinding chuck 150 is capable of rotating in either direction 154 or direction 156 about shaft 152, as well as the x-direction and y-direction. FIG. 2h is a top view of a rectangular grinding chuck 150 with a plurality of ports 158 formed in surface 159 to draw a vacuum on semiconductor wafer 146 to hold the wafer in place during movement and grinding. Rectangular grinding chuck 150 is capable of movement in the x-direction and y-direction.

FIG. 2i shows semiconductor wafer 146 mounted to grinding chuck 150. FIG. 2j is a top view of semiconductor wafer 146 mounted to grinding chuck 150. FIG. 2k is a top view of semiconductor wafer 146 as a round reconstituted wafer mounted to grinding chuck 150. Grinding chuck 150 with semiconductor wafer 146 is considered semiconductor manufacturing equipment intended to perform a manufacturing operation on the semiconductor wafer, e.g., planarization of encapsulant 140.

In FIG. 2l, a portion of encapsulant 140a is removed by grinder 160 to planarize surface 162 of the encapsulant. In one embodiment, grinder 160 is stationary and chuck 160 rotates about shaft 152 and moves laterally. Alternatively, chuck 160 rotates about shaft 152 and grinder 160 moves laterally. Notably, interconnect substrate 120 has reduced support in areas proximate to openings 142. Grinder 160 applies pressure to surface 162 of encapsulant 140a during planarization of the encapsulant. In the areas defined by openings 142, there is less supporting encapsulant material proximate to the openings under interconnect substrate 120. The thickness of encapsulant 140a above surface 126 is T1, and the thickness of encapsulant 140b between opening 142 and surface 128 is T3. Thickness T3 is less than thickness T1 or T2. Accordingly, interconnect substrate 120 is subject to bending, sinking, cracking, chipping, and other damages, particularly as the pressure and force of grinder 160 passes over the weak point in encapsulant 140b proximate to openings 142. FIG. 2l shows interconnect substrate 120 bending and cracking as grinder 160 passes over surface 162 in proximity to openings 142, as described in the background. Failures can occur when T3<40 μm.

Now consider the top view of grinding chuck 170 in FIG. 2m. Grinding chuck 170 is a circular or rectangular platform and support base for semiconductor wafer 146, similar to FIGS. 2g-2h. Grinding chuck 170 is capable of rotating in either direction 174 or direction 176 about shaft 178, as well as the x-direction and y-direction. A plurality of ports 180 are formed in surface 182 to draw a vacuum on semiconductor wafer 146 to hold the wafer in place during rotation and grinding. A plurality of protrusions or projections 188 extends from surface 182 of grinding chuck 170. Protrusions 188 are positioned on surface 182 to align with openings 142 in encapsulant 140b of semiconductor wafer 146.

Figure 3A:
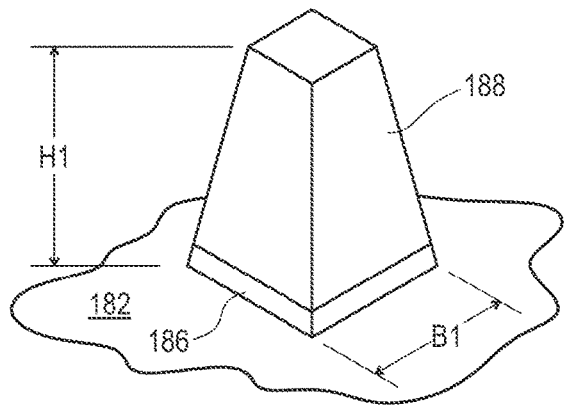
FIGS. 3a-3e illustrate a variety of protrusions attached to the support base.
Figure 3B:
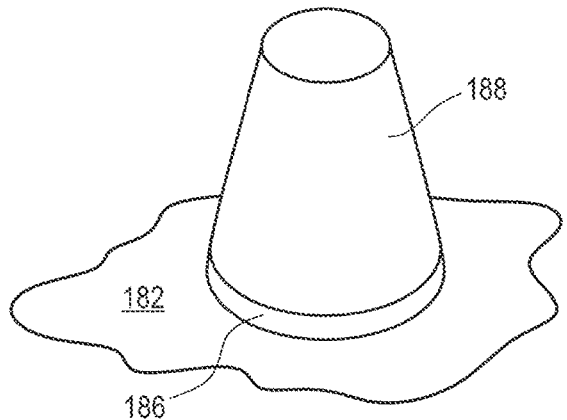
Figure 3C:
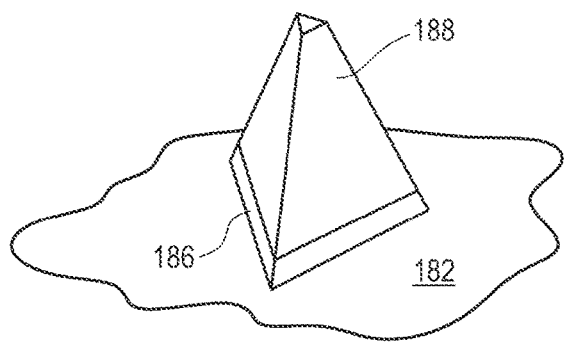
Figure 3D:
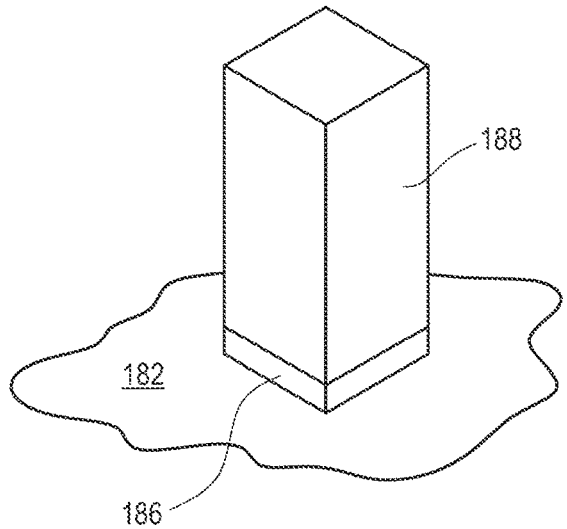
Figure 3E:
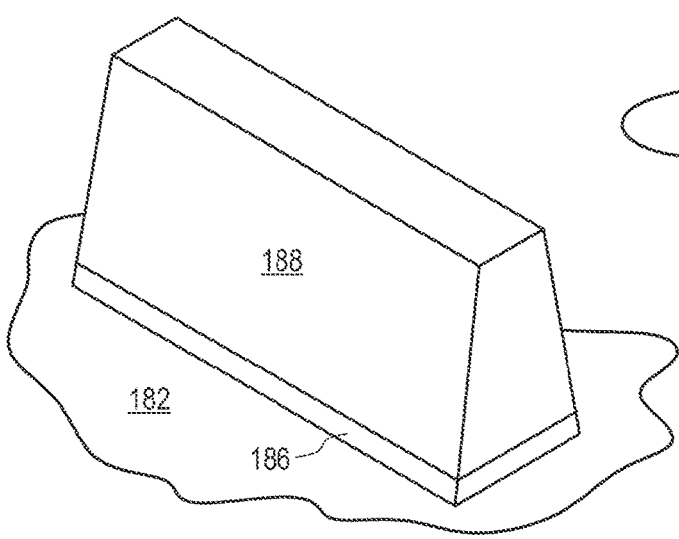

In FIG. 3a, protrusion 188 can be a square frustum or four-sided pyramid shape with a flat top. In FIG. 3b, protrusion 188 can be a conical frustum or cone shape with a flat top. In FIG. 3c, protrusion 188 can be a three-sided pyramid with a flat top. In FIG. 3d, protrusion 188 can be a four-sided rectangular body. In FIG. 3e, protrusion 188 can be an elongated square frustum with a flat top. In one embodiment, protrusion 188 has a height H1 of 500-700 μm, and base B1 of 1.0-2.0 mm. In general, protrusions 188 can be rectangular, circular, concave, convex, step-shape, or other geometric shape. Protrusions 188 can be made from any metal, ceramic, or polymer material, or other material have sufficient density and rigidity to provide structural support of interconnect substrate 120 and encapsulant 140. Protrusions 188 are attached to surface 182 with adhesive 186. Alternatively, protrusions 188 can be formed by removing a portion of surface 182 of grinding chuck 170 outside the protrusions, leaving the protrusions.

FIG. 2n shows semiconductor wafer 146 with electrical components 130a-103j mounted to interconnect substrate 120 and covered by encapsulant 140 mounted to grinding chuck 170 with protrusions 188 disposed within openings 142. Protrusion 188 fits the form-factor of opening 142. Protrusions 188 provide structural support for encapsulant 140b proximate to openings 142.

Now when a portion of encapsulant 140a is removed by grinder 190 to planarize surface 192 of the encapsulant, the areas proximate to openings 142 have additional structural support by nature of protrusions 188. Protrusions 188 operate as a filling material occupying at least a portion of openings 142 to support the area of semiconductor wafer 146 proximate to the openings. Grinder 190 applies pressure to surface 192 of encapsulant 140a during planarization of the encapsulant. In the areas defined by openings 142, the lesser amount of supporting encapsulant material proximate to the openings under interconnect substrate 120 is structurally reinforced by protrusions 188. The post-grinding thickness of encapsulant 140a is 0.15 mm. Accordingly, interconnect substrate 120 is at significantly less risk of bending, sinking, cracking, chipping, and other damages, particularly when subject to the pressure and force of grinder 190 passing over the reinforced location proximate to openings 142. FIG. 2o is a top view of semiconductor wafer 146 mounted to grinding chuck 150 with protrusions 188 disposed within openings 142.

Semiconductor wafer 146 is removed from grinding chuck 170. FIG. 2p illustrates semiconductor wafer 146 post grinding, after removal from grinding chuck 170. Surface 192 of encapsulant 140a is uniformly planarized to ±10 μm. Encapsulant 140b, between openings 142 and surface 128 of interconnect substrate 120, i.e., in areas 194, remains intact having been structurally reinforced by protrusions 188 during the grinding operation of FIG. 2n.

Openings 142 may have slanted sidewalls and flat bottom, as shown in FIG. 2e. In another embodiment, semiconductor wafer 196 may have openings 198 with more complex shapes, such as flat bottom 197 and ledges 199, as shown in FIG. 4.

In another embodiment, continuing from FIG. 4, semiconductor wafer 196 with electrical components 130a-103j mounted to interconnect substrate 120 and covered by encapsulant 140 is positioned over grinding chuck or support base 200, as shown in FIG. 5a. Semiconductor wafer 196 may contain many more electrical components. Electrical components 130a-130j are shown for illustration purposes and not drawn to scale. Grinding chuck 200 is a circular or rectangular platform and support base for semiconductor wafer 196, similar to FIGS. 2g-2h. Grinding chuck 200 is capable of rotating in either direction 202 or direction 204 about shaft 206, as well as the x-direction and y-direction. A penetrable film or tape 210 is deposited or disposed over surface 212 of grinding chuck 200 using PVD, CVD, printing, spin coating, spray coating, slit coating, rolling coating, lamination, or sintering. In one embodiment, penetrable film 210 is a polymer, epoxy, acryl-based B-stage material, or other similar material with penetrable properties. Penetrable film 210 has a thickness T4 of 500-700 µm.

Grinding chuck 200 with a plurality of ports draws a vacuum on semiconductor wafer 196 to press and hold the wafer in place during rotation and grinding, similar to FIGS. 2g-2h. When semiconductor wafer 196 is pressed onto grinding chuck 200, i.e., surface 148 of encapsulant 140b pressing into penetrable film 210, a portion of the penetrable film is pushed into openings 198. Accordingly, portion 210a of penetrable film 210 fills or occupies openings 198. Penetrable film 210 and 210a can be cured to increase its rigidity and support capability.

Figure 5B:
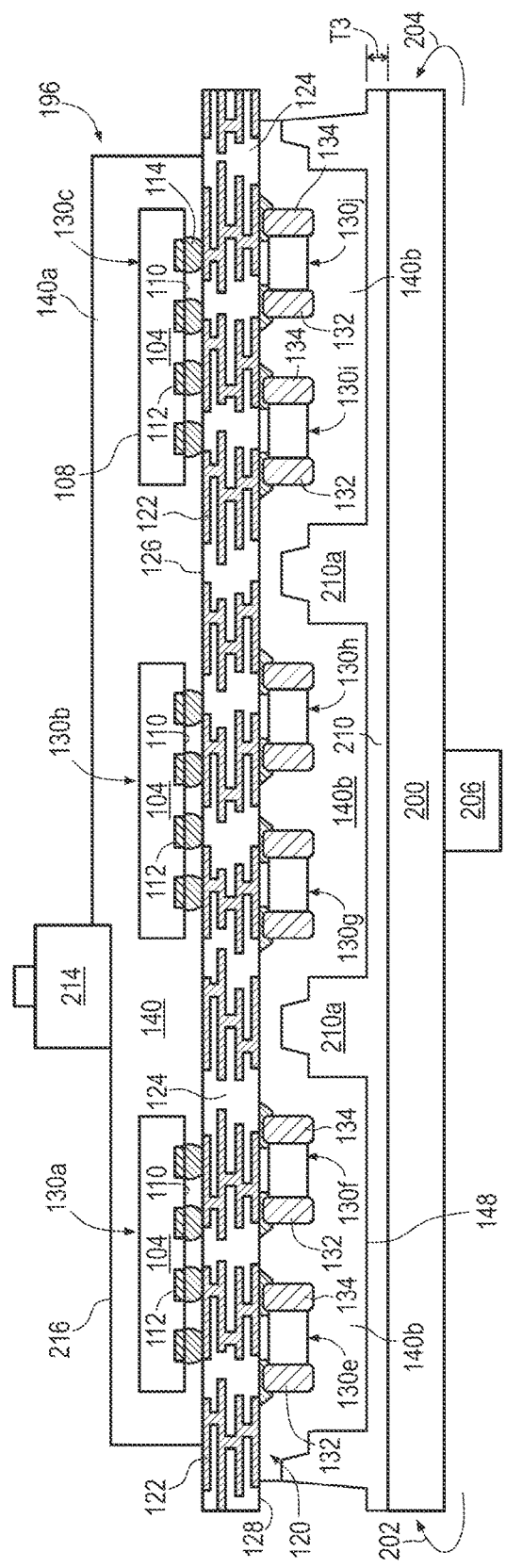

FIG. 5b shows semiconductor wafer 196 with electrical components 130a-103j mounted to interconnect substrate 120 and covered by encapsulant 140 mounted to grinding chuck 200 with penetrable film 210a disposed within openings 198. Penetrable film 210a fills the form-factor of opening 198. Penetrable film 210 provides structural support for encapsulant 140b in proximity of openings 198. Grinding chuck 200 with semiconductor wafer 196 is considered semiconductor manufacturing equipment intended to perform a manufacturing operation on the semiconductor wafer, e.g., planarization of encapsulant 140a.

As a portion of encapsulant 140a is removed by grinder 214 to planarize surface 216 of the encapsulant, the areas proximate to openings 198 have additional support by nature of penetrable film 210a. Penetrable film 210a operates as a filling material occupying openings 198 to support the area of semiconductor wafer 196 proximate to the openings. Grinder 214 applies pressure to surface 216 of encapsulant 140a during planarization of the encapsulant. In the areas defined by openings 198, the lesser amount of supporting encapsulant material proximate to the openings under interconnect substrate 120 is structurally reinforced by penetrable film 210a. Accordingly, interconnect substrate 120 is at significantly less risk of bending, sinking, cracking, chipping, and other damages, particularly when subject to the pressure and force of grinder 214 passing over the reinforced location proximate to openings 198.

Figure 5C:
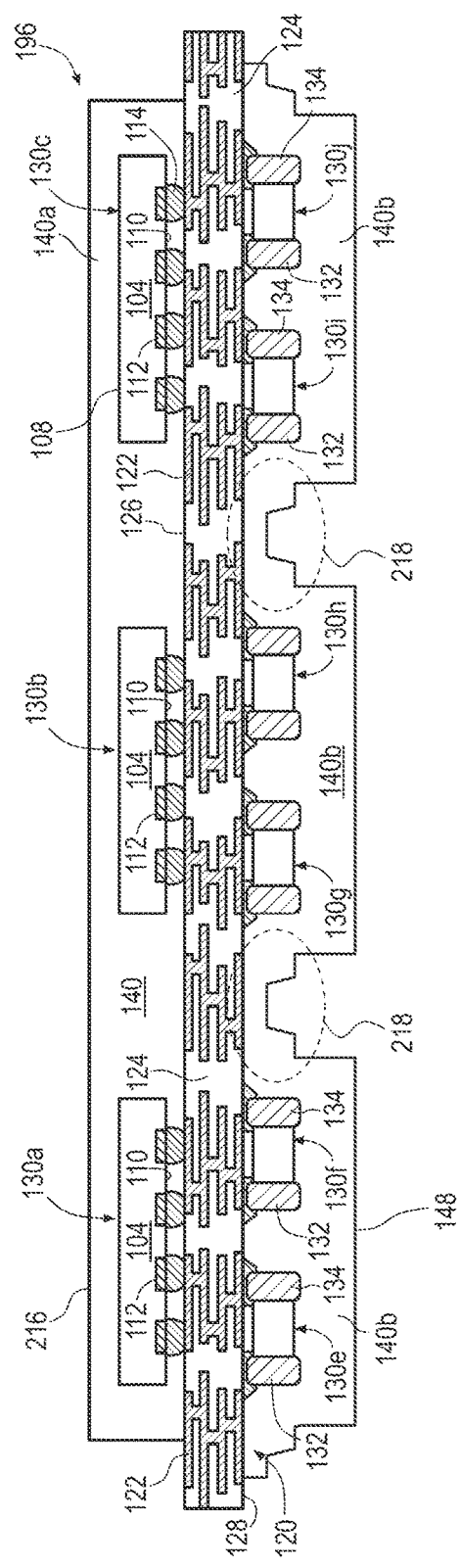

Semiconductor wafer 196 is removed from grinding chuck 200. FIG. 5c illustrates semiconductor wafer 196 post grinding, after removal from grinding chuck 200. Surface 216 of encapsulant 140a is uniformly planarized to ±10 µm. Encapsulant 140b, between openings 198 and surface 128 of interconnect substrate 120, i.e., in areas 218, remains intact having been structurally reinforced by penetrable film 210a during the grinding operation of FIG. 5b. Penetrable film 210 can also be used for openings 142 as in FIG. 2e.

Figure 6:
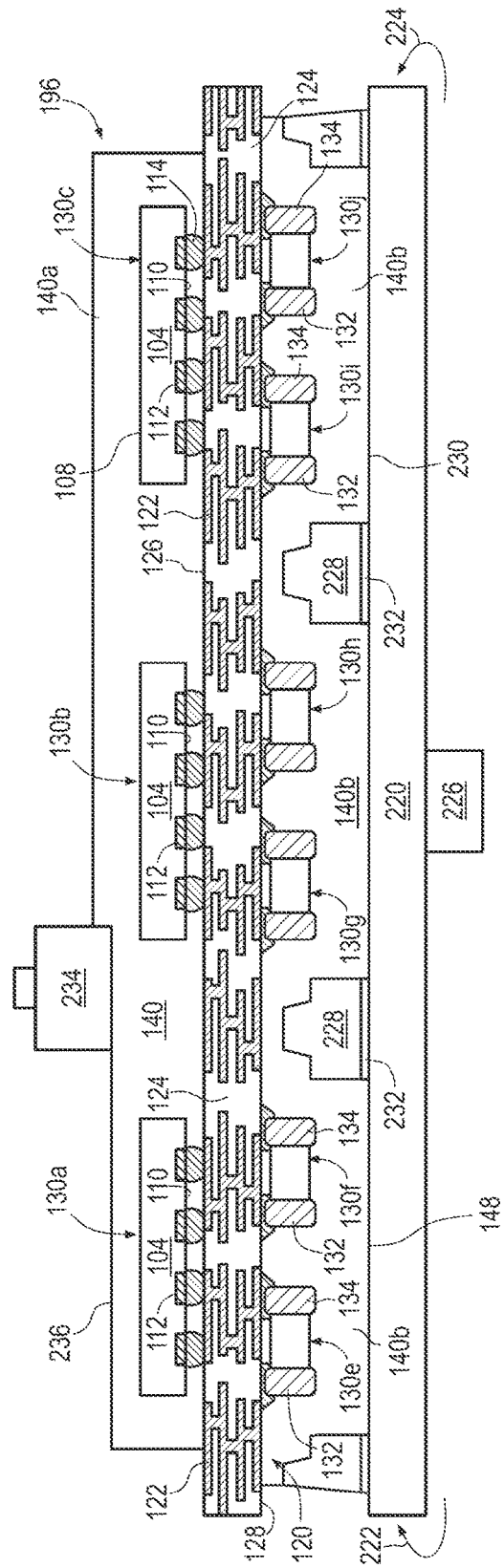
FIG. 6 illustrates another embodiment of the protrusions disposed into openings in the encapsulant.

In another embodiment, continuing from FIG. 4, semiconductor wafer 196 with electrical components 130a-103j mounted to interconnect substrate 120 and covered by encapsulant 140 is mounted to grinding chuck or support base 220, as shown in FIG. 6. Grinding chuck 220 is a circular or rectangular platform and support base for semiconductor wafer 196, similar to FIGS. 2g-2h. Grinding chuck 220 is capable of rotating in either direction 222 or direction 224 about shaft 226, as well as the x-direction and y-direction. A plurality of protrusions or projections 228 extends from surface 230 of grinding chuck 220, similar to FIG. 2m. Protrusions 228 are positioned on surface 230 to align with openings 198 in encapsulant 140b. Protrusions 228 have a shape matching the form-factor of opening 198. Protrusions 228 substantially fill openings 198. Protrusions 228 can be made from any metal, ceramic, or polymer material, or other material have sufficient density to provide support of and interconnect substrate 120 and encapsulant 140. Protrusions 228 are attached to surface 230 with adhesive 232.

Grinding chuck 220 with a plurality of ports draws a vacuum on semiconductor wafer 196 to press and hold the wafer in place during rotation and grinding, similar to FIGS. 2g-2h. Protrusions 228 provide structural support for encapsulant 140b in proximity of openings 198. Grinding chuck 220 with semiconductor wafer 196 is considered semiconductor manufacturing equipment intended to perform a manufacturing operation on the semiconductor wafer, e.g., planarization of encapsulant 140a.

When a portion of encapsulant 140a is removed by grinder 234 to planarize surface 236 of the encapsulant, the areas proximate to openings 198 have additional support by nature of protrusions 228. Protrusions 228 operate as a filling material occupying at least a portion of openings 198 to support the area of semiconductor wafer 196 proximate to the openings. Grinder 234 applies pressure to surface 236 of encapsulant 140a during planarization of the encapsulant. In the areas defined by openings 198, the lesser amount of supporting encapsulant material proximate to the openings under interconnect substrate 120 is structurally reinforced by protrusions 228. Accordingly, interconnect substrate 120 is at significantly less risk of bending, sinking, cracking, chipping, and other damages, particularly when subject to the pressure and force of grinder 234 passing over the reinforced location proximate to openings 198.

Figure 7:
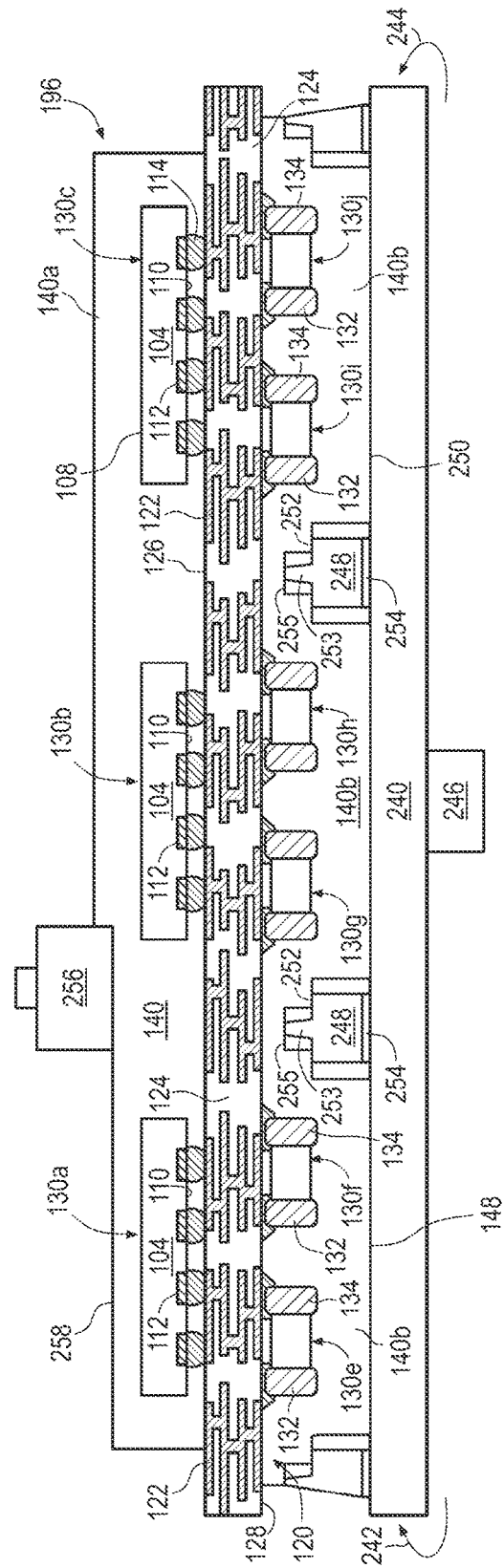
FIG. 7 illustrates another embodiment of the protrusions disposed into openings in the encapsulant.

In another embodiment, continuing from FIG. 4, semiconductor wafer 196 with electrical components 130a-103j mounted to interconnect substrate 120 and covered by encapsulant 140 is mounted to grinding chuck or support base 240, as shown in FIG. 7. Grinding chuck 240 is a circular or rectangular platform and support base for semiconductor wafer 196, similar to FIGS. 2g-2h. Grinding chuck 240 is capable of rotating in either direction 242 or direction 244 about shaft 246, as well as the x-direction and y-direction. A plurality of protrusions or projections 248 extends from surface 250 of grinding chuck 240, similar to FIG. 2m. Protrusions 248 are positioned on surface 250 to align with openings 198 in encapsulant 140b. Protrusions 248 have a shape narrower than the form-factor of opening 198. For example, protrusion 248 may have flat surface 252 for contacting ledge 199 and vertical projection 253 for contacting surface 255 of encapsulant 140b. Protrusions 248 can be made from any metal, ceramic, or polymer material, or other material having sufficient density to provide support of interconnect substrate 120 and encapsulant 140. Protrusions 248 are attached to surface 250 with adhesive 254.

Grinding chuck 240 with a plurality of ports draws a vacuum on semiconductor wafer 196 to press and hold the wafer in place during rotation and grinding, similar to FIGS. 2g-2h. Protrusion 248 fills a portion of the form-factor of opening 198, i.e., the protrusion is separated from the sidewalls of the opening. Protrusions 248 provide structural support for encapsulant 140b in proximity of openings 198. Grinding chuck 240 with semiconductor wafer 196 is considered semiconductor manufacturing equipment intended to perform a manufacturing operation on the semiconductor wafer, e.g., planarization of encapsulant 140a.

When a portion of encapsulant 140a is removed by grinder 256 to planarize surface 258 of the encapsulant, the areas proximate to openings 198 have additional support by nature of protrusions 248. Protrusions 248 operate as a filling material occupying at least a portion of openings 198 to support the area of semiconductor wafer 196 proximate to the openings. Grinder 256 applies pressure to surface 258 of encapsulant 140a during planarization of the encapsulant. In the areas defined by openings 198, the lesser amount of supporting encapsulant material proximate to the openings under interconnect substrate 120 is structurally reinforced by protrusions 248. Accordingly, interconnect substrate 120 is at significantly less risk of bending, sinking, cracking, chipping, and other damages, particularly when subject to the pressure and force of grinder 256 passing over the reinforced location proximate to openings 198.

In another embodiment, continuing from FIG. 4, semiconductor wafer 196 with electrical components 130a-103j mounted to interconnect substrate 120 and covered by encapsulant 140 is mounted to grinding chuck or support base 260, as shown in FIG. 8. Grinding chuck 260 is a circular or rectangular platform and support base for semiconductor wafer 196, similar to FIGS. 2g-2h. Grinding chuck 260 is capable of rotating in either direction 262 or direction 264 about shaft 266, as well as the x-direction and y-direction. A plurality of protrusions or projections 268 extends from surface 270 of grinding chuck 260, similar to FIG. 2m. Protrusions 268 are positioned on surface 270 to align with openings 198 in encapsulant 140b. Protrusions 268 have a shape narrower than the form-factor of opening 198. For example, protrusion 268 may have vertical projection 272 for contacting surface 275 of encapsulant 140b. Protrusion 268 occupies a center of opening 198. Protrusions 268 can be made from any metal, ceramic, or polymer material, or other material have sufficient density to provide support of and interconnect substrate 120 and encapsulant 140. Protrusions 268 are attached to surface 270 with adhesive 274.

Grinding chuck 260 with a plurality of ports draws a vacuum on semiconductor wafer 196 to press and hold the wafer in place during rotation and grinding, similar to FIGS. 2g-2h. Protrusion 268 fills a portion of the form-factor of opening 198, i.e., the protrusion is separated from the sidewalls of the opening. Protrusions 268 provide structural support for encapsulant 140b in proximity of openings 198. Grinding chuck 260 with semiconductor wafer 196 is considered semiconductor manufacturing equipment intended to perform a manufacturing operation on the semiconductor wafer, e.g., planarization of encapsulant 140a.

When a portion of encapsulant 140a is removed by grinder 276 to planarize surface 278 of the encapsulant, the areas proximate to openings 198 have additional support by nature of protrusions 268. Protrusions 268 operate as a filling material occupying at least a portion of openings 198 to support the area of semiconductor wafer 196 proximate to the openings. Grinder 276 applies pressure to surface 278 of encapsulant 140a during planarization of the encapsulant. In the areas defined by openings 198, the lesser amount of supporting encapsulant material proximate to the openings under interconnect substrate 120 is structurally reinforced by protrusions 268. Accordingly, interconnect substrate 120 is at significantly less risk of bending, sinking, cracking, chipping, and other damages, particularly when subject to the pressure and force of grinder 276 passing over the reinforced location proximate to openings 198.

In another embodiment, continuing from FIG. 4, semiconductor wafer 196 with electrical components 130a-103j mounted to interconnect substrate 120 and covered by encapsulant 140 is mounted to grinding chuck or support base 280, as shown in FIG. 9. Grinding chuck 280 is a circular or rectangular platform and support base for semiconductor wafer 196, similar to FIGS. 2g-2h. Grinding chuck 280 is capable of rotating in either direction 282 or direction 284 about shaft 286, as well as the x-direction and y-direction. A plurality of protrusions or projections 288 extends from surface 290 of grinding chuck 280, similar to FIG. 2m. Protrusions 288 are positioned on surface 290 to align with openings 198 in encapsulant 140b. Protrusions 288 have a shape narrower than the form-factor of opening 198. For example, protrusion 288 contacts surface 292 of encapsulant 140b. Protrusion 288 occupies a center of opening 198. Protrusions 288 can be made from any metal, ceramic, or polymer material, or other material have sufficient density to provide support of and interconnect substrate 120 and encapsulant 140. Protrusions 288 are attached to surface 290 with adhesive 294.

Grinding chuck 280 with a plurality of ports draws a vacuum on semiconductor wafer 196 to press and hold the wafer in place during rotation and grinding, similar to FIGS. 2g-2h. Protrusion 288 fills a portion of the form-factor of opening 198, i.e., the protrusion is separated from the sidewalls of the opening. Protrusions 288 provide structural support for encapsulant 140b in proximity of openings 198. Grinding chuck 280 with semiconductor wafer 196 is considered semiconductor manufacturing equipment intended to perform a manufacturing operation on the semiconductor wafer, e.g., planarization of encapsulant 140a.

When a portion of encapsulant 140a is removed by grinder 296 to planarize surface 298 of the encapsulant, the areas proximate to openings 198 have additional support by nature of protrusions 288. Protrusions 288 operate as a filling material occupying at least a portion of openings 198 to support the area of semiconductor wafer 196 proximate to the openings. Grinder 296 applies pressure to surface 298 of encapsulant 140a during planarization of the encapsulant. In the areas defined by openings 198, the lesser amount of supporting encapsulant material proximate to the openings under interconnect substrate 120 is structurally reinforced by protrusions 288. Accordingly, interconnect substrate 120 is at significantly less risk of bending, sinking, cracking, chipping, and other damages, particularly when subject to the pressure and force of grinder 296 passing over the reinforced location proximate to openings 198.

Semiconductor wafer 196 is removed from the grinding chuck of FIGS. 6-9. The surface of encapsulant 140a is uniformly planarized to ±10 µm. Encapsulant 140b, between openings 198 and surface 128 of interconnect substrate 120 remains intact having been structurally reinforced by the protrusions during the grinding operation. The protrusions can also be used for openings 142 as in FIG. 2e.

FIG. 10 illustrates electronic device 300 having a chip carrier substrate or PCB 302 with a plurality of semiconductor packages mounted on a surface of PCB 302. Electronic device 300 can have one type of semiconductor package, or multiple types of semiconductor packages, depending on the application.

Electronic device 300 can be a stand-alone system that uses the semiconductor packages to perform one or more electrical functions. Alternatively, electronic device 300 can be a subcomponent of a larger system. For example, electronic device 300 can be part of a tablet, cellular phone, digital camera, communication system, or other electronic device. Alternatively, electronic device 300 can be a graphics card, network interface card, or other signal processing card that can be inserted into a computer. The semiconductor package can include microprocessors, memories, ASIC, logic circuits, analog circuits, RF circuits, discrete devices, or other semiconductor die or electrical components. Miniaturization and weight reduction are essential for the products to be accepted by the market. The distance between semiconductor devices may be decreased to achieve higher density.

In FIG. 10, PCB 302 provides a general substrate for structural support and electrical interconnect of the semiconductor packages mounted on the PCB. Conductive signal traces 304 are formed over a surface or within layers of PCB 302 using evaporation, electrolytic plating, electroless plating, screen printing, or other suitable metal deposition process. Signal traces 304 provide for electrical communication between each of the semiconductor packages, mounted components, and other external system components. Traces 304 also provide power and ground connections to each of the semiconductor packages.

In some embodiments, a semiconductor device has two packaging levels. First level packaging is a technique for mechanically and electrically attaching the semiconductor die to an intermediate substrate. Second level packaging involves mechanically and electrically attaching the intermediate substrate to the PCB. In other embodiments, a semiconductor device may only have the first level packaging where the die is mechanically and electrically mounted directly to the PCB. For the purposes of illustration, several types of first level packaging, including bond wire package 306 and flipchip 308, are shown on PCB 302. Additionally, several types of second level packaging, including ball grid array (BGA) 310, bump chip carrier (BCC) 312, land grid array (LGA) 316, multi-chip module (MCM) or SIP module 318, quad flat non-leaded package (QFN) 320, quad flat package 322, embedded wafer level ball grid array (eWLB) 324, and wafer level chip scale package (WLCSP) 326 are shown mounted on PCB 302. In one embodiment, eWLB 324 is a fan-out wafer level package (Fo-WLP) and WLCSP 326 is a fan-in wafer level package (Fi-WLP). Depending upon the system requirements, any combination of semiconductor packages, configured with any combination of first and second level packaging styles, as well as other electronic components, can be connected to PCB 302. In some embodiments, electronic device 300 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
   providing a support base adapted for rotating about an axis or providing linear motion;
   forming a plurality of protrusions on the support base;
   providing a semiconductor wafer;
   depositing an encapsulant over the semiconductor wafer;
   forming a plurality of openings in the encapsulant; and
   disposing the semiconductor wafer over the support base with the protrusions extending into the openings in the encapsulant to contact a bottom surface of the openings and provide structural support and alignment of the semiconductor wafer and rotation or linear motion for the semiconductor wafer.

2. The method of claim 1, further including attaching the protrusions to the support base with an adhesive.

3. The method of claim 1, wherein the protrusions substantially fill the openings in the encapsulant.

4. The method of claim 1, wherein the protrusions partially fill the openings in the encapsulant.

5. The method of claim 1, wherein the protrusions include a shape selected from a group consisting of a square frustum, conical frustum, three-sided pyramid with a flat top, and four-sided rectangular body, and elongated square frustum.

6. The method of claim 1, wherein the protrusions occupy a center of the openings in the encapsulant.

7. A method of making a semiconductor device, comprising:
   providing a support base adapted for rotating about an axis or providing linear motion;
   forming a filling material on the support base;
   providing a semiconductor wafer;
   depositing an encapsulant over the semiconductor wafer;
   forming an opening in the encapsulant; and
   disposing the semiconductor wafer over the support base with the filling material extending into the opening in the encapsulant to contact a bottom surface of the opening and provide rotation or linear motion for the semiconductor wafer.

8. The method of claim 7, wherein the filling material substantially fills the opening in the encapsulant.

9. The method of claim 7, wherein the filling material includes a penetrable film.

10. The method of claim 7, wherein the filling material includes a protrusion.

11. The method of claim 10, further including attaching the protrusion to the support base with an adhesive.

12. The method of claim 10, wherein the protrusion partially fills the openings in the encapsulant.

13. The method of claim 10, wherein the protrusion includes a shape selected from a group consisting of a square frustum, conical frustum, three-sided pyramid with a flat top, and four-sided rectangular body, and elongated square frustum.

14. A semiconductor manufacturing equipment, comprising:
   a support base adapted for rotating about an axis or providing linear motion;
   a plurality of protrusions formed on the support base;
   a semiconductor wafer; and
   an encapsulant deposited over the semiconductor wafer;
   wherein the semiconductor wafer is disposed over the support base with the protrusions extending into openings in the encapsulant to contact a bottom surface of the openings and provide rotation or linear motion for the semiconductor wafer.

15. The semiconductor manufacturing equipment of claim 14, wherein the protrusions include a shape selected from a group consisting of a square frustum, conical frustum, three-sided pyramid with a flat top, and four-sided rectangular body, and elongated square frustum.

16. The semiconductor manufacturing equipment of claim 14, wherein the protrusions are attached to the support base with an adhesive.

17. The semiconductor manufacturing equipment of claim 14, wherein the protrusions substantially fill the openings in the encapsulant.

18. The semiconductor manufacturing equipment of claim 14, wherein the protrusions partially fill the openings in the encapsulant.

19. The semiconductor manufacturing equipment of claim 14, wherein the protrusions occupy a center of the openings in the encapsulant.

20. A semiconductor manufacturing equipment, comprising:
- a support base adapted for rotating about an axis or providing linear motion;
- a filling material formed on the support base; and
- a semiconductor wafer; and
- an encapsulant deposited over the semiconductor wafer;
- wherein the semiconductor wafer is disposed over the support base with the filling material extending into an opening in the encapsulant to contact a bottom surface of the opening and provide rotation or linear motion for the semiconductor wafer.

21. The semiconductor manufacturing equipment of claim 20, wherein the filling material substantially fills the opening in the encapsulant.

22. The semiconductor manufacturing equipment of claim 20, wherein the filling material includes a penetrable film.

23. The semiconductor manufacturing equipment of claim 20, wherein the filling material includes a protrusion.

24. The semiconductor manufacturing equipment of claim 20, wherein the protrusion is attached to the support base with an adhesive.

25. The semiconductor manufacturing equipment of claim 20, wherein the protrusion partially fills the opening in the encapsulant.

\* \* \* \* \*